United States Patent
Dai et al.

(10) Patent No.: US 11,777,532 B2
(45) Date of Patent: Oct. 3, 2023

(54) ENCODING METHOD, APPARATUS, AND DEVICE AND COMPUTER-READABLE STORAGE MEDIUM

(71) Applicant: HUAWEI TECHNOLOGIES CO., LTD., Shenzhen (CN)

(72) Inventors: Shengchen Dai, Hangzhou (CN); Huazi Zhang, Hangzhou (CN); Xianbin Wang, Hangzhou (CN); Lingchen Huang, Hangzhou (CN); Rong Li, Hangzhou (CN); Yunfei Qiao, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/587,425

(22) Filed: Jan. 28, 2022

(65) Prior Publication Data
US 2022/0158659 A1      May 19, 2022

Related U.S. Application Data

(63) Continuation of application No. PCT/CN2020/103535, filed on Jul. 22, 2020.

(30) Foreign Application Priority Data

Jul. 31, 2019 (CN) .......................... 201910704780.0

(51) Int. Cl.
H03M 13/00 (2006.01)
(52) U.S. Cl.
CPC ................. *H03M 13/616* (2013.01)
(58) Field of Classification Search
CPC ................................ H03M 13/616
See application file for complete search history.

(56) References Cited

U.S. PATENT DOCUMENTS

| 2011/0268090 A1 | 11/2011 | Qu et al. |
| 2016/0182187 A1 | 6/2016 | Kim et al. |

(Continued)

FOREIGN PATENT DOCUMENTS

| CN | 107026709 A | 8/2017 |
| CN | 107294652 A | 10/2017 |

(Continued)

OTHER PUBLICATIONS

International Search Report issued in corresponding International Application No. PCT/CN2020/103535, dated Oct. 29, 2020, pp. 1-11.

(Continued)

*Primary Examiner* — Samir W Rizk
(74) *Attorney, Agent, or Firm* — HAUPTMAN HAM, LLP

(57) ABSTRACT

An encoding method includes, when a first code rate K/Nmax is less than or equal to a code rate threshold Rt, reading a first matrix from a preset code table based on a second matrix. The second matrix includes a matrix that is read from the preset code table and that corresponds to a maximum supported code length Nmax and Rt, where K is an integer and N is an integer. The method also includes reading K rows and (N−K) columns starting from a preset first location in the first matrix to obtain a third matrix. The method further includes adding a unit matrix with K rows and K columns to a left side of the third matrix to obtain a generator matrix of an (N, K) linear block code. K rows and (Nmax−Nmax×Rt) columns of the second matrix in a first direction are consistent with K rows and (Nmax−Nmax×Rt) columns of the first matrix in a second direction.

20 Claims, 15 Drawing Sheets

(56) References Cited

U.S. PATENT DOCUMENTS

2017/0201348 A1\* 7/2017 Jang ..................... H04L 1/08
2018/0034587 A1   2/2018 Kim et al.

FOREIGN PATENT DOCUMENTS

| CN | 107370560 A | 11/2017 |
| CN | 107404322 A | 11/2017 |
| CN | 109314525 A | 2/2019 |

OTHER PUBLICATIONS

Chinese Office Action issued in corresponding Chinese Application No. 201910704780.0, dated Jul. 22, 2022, pp. 1-6.
Chinese Published Patent Document 112311402B, dated Apr. 18, 2023, pp. 1-38.

\* cited by examiner

FIG. 6A

FIG. 6B (Adjacent to the foregoing table from the right side)

FIG. 7

ENCODING METHOD, APPARATUS, AND DEVICE AND COMPUTER-READABLE STORAGE MEDIUM

CROSS-REFERENCE TO RELATED APPLICATIONS

This application is a continuation of International Application No. PCT/CN2020/103535, filed on Jul. 22, 2020, which claims priority to Chinese Patent Application No. 201910704780.0, filed on Jul. 31, 2019. The disclosures of the aforementioned applications are hereby incorporated by reference in their entireties.

TECHNICAL FIELD

The present invention relates to the field of communications technologies, and in particular, to an encoding method, an encoding apparatus, an encoding device, and a computer-readable storage medium.

BACKGROUND

Because of interference and fading in mobile communication, an error may occur on a signal during transmission. Therefore, error correction and detection technologies, that is, error correction and detection encoding technologies, need to be used for a digital signal to enhance a capability of resisting various types of interference during transmission of data on a channel and improve system reliability Channel coding is performing error correction and detection on a digital signal that needs to be transferred on a channel.

In a 5G standard, a polar (polar) code encoding solution is used for a control channel of enhanced mobile broadband (enhanced mobile broadband, eMBB), a low-density parity-check (low-density parity-check, LDPC) encoding solution is used for a data channel, and automatic repeat request of incremental redundancy is used for LDPC encoding. In future 5G beyond or 6G, performance of a code supporting automatic repeat request (automatic repeat request, ARQ) may be further improved.

In most wireless packet transmission systems, ARQ and forward error correction (forward error correction, FEC) are used in combination, namely, a hybrid automatic repeat request (hybrid automatic repeat request, HARQ) mechanism. In HARQ, FEC is used to reduce a quantity of retransmissions and reduce a bit error rate, and ARQ retransmission and cyclic redundancy check (cyclic redundancy check, CRC) are used to ensure occasions requiring an extremely low bit error rate, for example, packet data transmission. This mechanism is a compromise solution. An error is automatically corrected within an error correction capability range, and a transmit end needs to perform resending when an error falls beyond the error correction range, so that system reliability and system transmission efficiency are improved.

In a conventional technology, an existing Reed-Muller (Reed-Muller) code in long term evolution (long term evolution, LTE), namely, an LTE-RM code, is applied to receiving/transmitting short signaling on an uplink control channel and a downlink control channel in an LTE system. The LTE-RM code may be implemented by combining three RM codes based on an application scenario. For the first RM code (20, 13), an information bit length is a positive integer less than or equal to 13, and a codeword length obtained through encoding is 20 bits. For the second RM code (32, 11), an information bit length is a positive integer less than or equal to 11, and a codeword length obtained through encoding is 32 bits. For the third RM code, an information bit length is a positive integer greater than or equal to 12 and less than or equal to 22, and a codeword length obtained through encoding is 48 bits. An encoding process is as follows: An information vector is first divided into two vectors whose length difference is less than or equal to 1 bit, the two vectors are separately encoded to obtain two codewords whose lengths are 24, and the two codewords are concatenated to obtain a final encoded codeword.

In other words, a binary information vector length supported by the LTE-RM code is a positive integer less than or equal to 22. Therefore, a work range of the LTE-RM code is quite limited, in other words, a length of an encoded codeword is limited. In addition, the LTE-RM code has poor performance and does not support incremental HARQ when the information vector length is less than or equal to 5.

SUMMARY

Embodiments of the present invention disclose an encoding method, an encoding apparatus, and an encoding device, to resolve technical problems in a conventional technology that a work range of an LTE-RM code is quite limited and the LTE-RM code has poor performance and does not support incremental HARQ when an information vector length is less than or equal to 5.

According to a first aspect, an embodiment of this application provides an encoding method, and the method includes:

when a first code rate K/Nmax is less than or equal to a code rate threshold Rt, reading a second matrix from a preset code table based on a first matrix, where the first matrix includes a matrix that is read from the preset code table and that corresponds to a maximum supported code length Nmax and Rt;

reading K rows and (N−K) columns starting from a preset first location in the second matrix to obtain a third matrix; and adding a unit matrix with K rows and K columns to a left side of the third matrix to obtain a generator matrix of an (N, K) linear block code, where K rows and (Nmax−Nmax×Rt) columns of the first matrix in a first direction are consistent with K rows and (Nmax−Nmax×Rt) columns of the second matrix in a second direction.

According to the encoding method provided in this embodiment of this application, when the first code rate K/Nmax is less than or equal to the code rate threshold Rt, a linear block code with a nested structure may be obtained, and a linear block code with a nested structure that is obtained through search has relatively fine performance. Therefore, when decoding is performed by using the linear block code with a nested structure in this embodiment of this application, the nested structure is conducive to implementing HARQ.

In a possible implementation, the reading a second matrix from a preset code table based on a first matrix includes:

reading K rows and (Nmax−Nmax×Rt) columns of the first matrix in the first direction from the preset code table to obtain a matrix Z21;

reading K rows and (Nmax×Rt−K) columns adjacent to the matrix Z21 in a third direction from the preset code table to obtain a matrix Z22, where the third direction is opposite to the second direction; and combining the matrix Z21 and the matrix Z22 to obtain the second matrix.

The second matrix is read from the first matrix in the foregoing manner, so that there is a nested relationship between the second matrix and the first matrix. In addition, when N remains unchanged, there is also a nested relationship between different second matrices read each time.

In a possible implementation, the reading K rows and (N−K) columns starting from a preset first location in the second matrix to obtain a third matrix includes:
  reading K rows and (N−K) columns starting from the leftmost or the rightmost in the second matrix to obtain the third matrix.

The third matrix is read starting from the leftmost or the rightmost, so that when K remains unchanged, there is also a nested relationship between different third matrices read each time. This can improve reading efficiency and encoding efficiency.

In a possible implementation, the encoding method may further include:
  when the first code rate K/Nmax is greater than the code rate threshold Rt, reading a fourth matrix from the preset code table based on the first matrix;
  reading K rows and (N−K) columns starting from a preset second location in the fourth matrix to obtain a fifth matrix; and
  adding a unit matrix with K rows and K columns to a left side of the fifth matrix to obtain a generator matrix of an (N, K) linear block code, where
  Nmax×Rt rows and (Nmax−K) columns of the first matrix in the second direction are consistent with Nmax×Rt rows and (Nmax−K) columns of the fourth matrix in the first direction.

According to the encoding method provided in this embodiment of this application, when the first code rate K/Nmax is greater than the code rate threshold Rt, a linear block code with a nested structure may be obtained, and a linear block code with a nested structure that is obtained through search has relatively fine performance. Therefore, when decoding is performed by using the linear block code with a nested structure in this embodiment of this application, the nested structure is conducive to implementing HARQ.

In a possible implementation, the reading a fourth matrix from the preset code table based on the first matrix includes:
  reading Nmax×Rt rows and (Nmax−K) columns of the first matrix in the second direction from the preset code table to obtain a matrix Z23;
  reading (K−Nmax×Rt) rows and (Nmax−K) columns adjacent to the matrix Z23 in a fourth direction from the preset code table to obtain a matrix Z24, where the fourth direction is opposite to the first direction; and
  combining the matrix Z23 and the matrix Z24 to obtain the fourth matrix.

The fourth matrix is read from the first matrix in the foregoing manner, so that there is a nested relationship between the fourth matrix and the first matrix. In addition, when N remains unchanged, there is also a nested relationship between different fourth matrices read each time.

In a possible implementation, the reading K rows and (N−K) columns starting from a preset second location in the fourth matrix to obtain a fifth matrix includes:
  reading K rows and (N−K) columns starting from the leftmost or the rightmost in the fourth matrix to obtain the fifth matrix.

The fifth matrix is read starting from the leftmost or the rightmost, so that when K remains unchanged, there is also a nested relationship between different fifth matrices read each time. This can improve reading efficiency and encoding efficiency.

In a possible implementation,
  the first direction is a topmost part of a matrix, and the second direction is a rightmost part of the matrix; or
  the first direction is a bottommost part of a matrix, and the second direction is a rightmost part of the matrix; or
  the first direction is a topmost part of a matrix, and the second direction is a leftmost part of the matrix; or
  the first direction is a bottommost part of a matrix, and the second direction is a leftmost part of the matrix.

Directions may include but not limited to the foregoing directions in this application, provided that a nested relationship of the linear block code in this embodiment of this application is met.

In a possible implementation, when K is K1, the read second matrix is Z4; or when K is K2, the read second matrix is Z5; and
  if K1 is less than K2 and N of Z4 is the same as N of Z5, K1 rows and (N−K2) columns of Z4 in the second direction are consistent with K1 rows and (N−K2) columns of Z5 in the first direction.

In a possible implementation, when N is N1, the third matrix obtained by reading K rows and (N1−K) columns starting from the preset first location in the second matrix is Z6; or when N is N2, the third matrix obtained by reading K rows and (N2−K) columns starting from the preset first location in the second matrix is Z7; and
  if N1 is less than N2, K rows and (N1−K) columns of Z7 starting from the preset first location are consistent with Z6.

According to the encoding method in this embodiment of this application, incremental HARQ can be supported. When a quantity of sent information bits remains unchanged (K remains unchanged), if previous decoding (for example, the previous decoding of (30, 12)) fails, a receive end feeds back information about a decoding failure to a transmit end. If the transmit end sends a (32, 12) linear block code by using the encoding method in this embodiment of this application, the transmit end only needs to send an incremental part (that is, incremental 12 rows and 2 columns) obtained after a code length becomes larger. After receiving the incremental part, the receive end may decode the previous reception result and the incremental part together.

According to a second aspect, an embodiment of this application provides an encoding method, including:
  when a first code rate K/Nmax is greater than a code rate threshold Rt, reading a fourth matrix from a preset code table based on a first matrix, where the first matrix includes a matrix that is read from the preset code table and that corresponds to a maximum supported code length Nmax and Rt;
  reading K rows and (N−K) columns starting from a preset second location in the fourth matrix to obtain a fifth matrix; and
  adding a unit matrix with K rows and K columns to a left side of the fifth matrix to obtain a generator matrix of an (N, K) linear block code, where
  Nmax×Rt rows and (Nmax−K) columns of the first matrix in a second direction are consistent with Nmax×Rt rows and (Nmax−K) columns of the fourth matrix in a first direction.

In a possible implementation, the reading a fourth matrix from a preset code table based on a first matrix includes:

reading Nmax×Rt rows and (Nmax−K) columns of the first matrix in the second direction from the preset code table to obtain a matrix Z23;

reading (K−Nmax×Rt) rows and (Nmax−K) columns adjacent to the matrix Z23 in a fourth direction from the preset code table to obtain a matrix Z24, where the fourth direction is opposite to the first direction; and combining the matrix Z23 and the matrix Z24 to obtain the fourth matrix.

In a possible implementation, the reading K rows and (N−K) columns starting from a preset second location in the fourth matrix to obtain a fifth matrix includes:

reading K rows and (N−K) columns starting from the leftmost or the rightmost in the fourth matrix to obtain the fifth matrix.

In a possible implementation, when K is K1, the read second matrix is Z4; or when K is K2, the read second matrix is Z5; and if K1 is less than K2 and N of Z4 is the same as N of Z5, K1 rows and (N−K2) columns of Z4 in the second direction are consistent with K1 rows and (N−K2) columns of Z5 in the first direction.

In a possible implementation, when N is N1, the fifth matrix obtained by reading K rows and (N1−K) columns starting from the preset second location in the fourth matrix is Z6; or when N is N2, the fifth matrix obtained by reading K rows and (N2−K) columns starting from the preset second location in the fourth matrix is Z7; and if N1 is less than N2, K rows and (N1−K) columns of Z7 starting from the preset second location are consistent with Z6.

According to a third aspect, an embodiment of this application provides an encoding apparatus, including:

a first reading unit, configured to: when a first code rate K/Nmax is less than or equal to a code rate threshold Rt, read a second matrix from a preset code table based on a first matrix, where the first matrix includes a matrix that is read from the preset code table and that corresponds to a maximum supported code length Nmax and Rt;

a second reading unit, configured to read K rows and (N−K) columns starting from a preset first location in the second matrix to obtain a third matrix; and a first adding unit, configured to add a unit matrix with K rows and K columns to a left side of the third matrix to obtain a generator matrix of an (N, K) linear block code, where K rows and (Nmax−Nmax×Rt) columns of the first matrix in a first direction are consistent with K rows and (Nmax−Nmax×Rt) columns of the second matrix in a second direction.

In a possible implementation, the first reading unit is specifically configured to: when the first code rate K/Nmax is less than or equal to the code rate threshold Rt, read K rows and (Nmax−Nmax×Rt) columns of the first matrix in the first direction from the preset code table to obtain a matrix Z21; read K rows and (Nmax×Rt−K) columns adjacent to the matrix Z21 in a third direction from the preset code table to obtain a matrix Z22, where the third direction is opposite to the second direction; and combine the matrix Z21 and the matrix Z22 to obtain the second matrix.

In a possible implementation, the second reading unit is specifically configured to read K rows and (N−K) columns starting from the leftmost or the rightmost in the second matrix to obtain the third matrix.

In a possible implementation, the encoding apparatus further includes:

a third reading unit, configured to: when the first code rate K/Nmax is greater than the code rate threshold Rt, read a fourth matrix from the preset code table based on the first matrix;

a fourth reading unit, configured to read K rows and (N−K) columns starting from a preset second location in the fourth matrix to obtain a fifth matrix; and a second adding unit, configured to add a unit matrix with K rows and K columns to a left side of the fifth matrix to obtain a generator matrix of an (N, K) linear block code, where Nmax×Rt rows and (Nmax×K) columns of the first matrix in the second direction are consistent with Nmax×Rt rows and (Nmax×K) columns of the fourth matrix in the first direction.

In a possible implementation, the third reading unit is specifically configured to: when the first code rate K/Nmax is greater than the code rate threshold Rt, read Nmax×Rt rows and (Nmax×K) columns of the first matrix in the second direction from the preset code table to obtain a matrix Z23; read (K−Nmax×Rt) rows and (Nmax×K) columns adjacent to the matrix Z23 in a fourth direction from the preset code table to obtain a matrix Z24, where the fourth direction is opposite to the first direction; and combine the matrix Z23 and the matrix Z24 to obtain the fourth matrix.

In a possible implementation, the fourth reading unit is specifically configured to read K rows and (N−K) columns starting from the leftmost or the rightmost in the fourth matrix to obtain the fifth matrix.

In a possible implementation, the first direction is a topmost part of a matrix, and the second direction is a rightmost part of the matrix; or the first direction is a bottommost part of a matrix, and the second direction is a rightmost part of the matrix; or the first direction is a topmost part of a matrix, and the second direction is a leftmost part of the matrix; or the first direction is a bottommost part of a matrix, and the second direction is a leftmost part of the matrix.

In a possible implementation, when K is K1, the read second matrix is Z4; or when K is K2, the read second matrix is Z5; and if K1 is less than K2 and N of Z4 is the same as N of Z5, K1 rows and (N−K2) columns of Z4 in the second direction are consistent with K1 rows and (N−K2) columns of Z5 in the first direction.

In a possible implementation, when N is N1, the third matrix obtained by reading K rows and (N1−K) columns starting from the preset first location in the second matrix is Z6; or when N is N2, the third matrix obtained by reading K rows and (N2−K) columns starting from the preset first location in the second matrix is Z7; and if N1 is less than N2, K rows and (N1−K) columns of Z7 starting from the preset first location are consistent with Z6.

According to a fourth aspect, an embodiment of this application provides an encoding apparatus, including:

a third reading unit, configured to: when a first code rate K/Nmax is greater than a code rate threshold Rt, read a fourth matrix from a preset code table based on a first matrix, where the first matrix includes a matrix that is read from the preset code table and that corresponds to a maximum supported code length Nmax and Rt;

a fourth reading unit, configured to read K rows and (N−K) columns starting from a preset second location in the fourth matrix to obtain a fifth matrix; and a second adding unit, configured to add a unit matrix with K rows and K columns to a left side of the fifth matrix to obtain a generator matrix of an (N, K) linear block code, where Nmax×Rt rows and (Nmax−K) columns of the first matrix in a second direction are consistent with Nmax×Rt rows and (Nmax−K) columns of the fourth matrix in a first direction.

In a possible implementation, the third reading unit is specifically configured to: when the first code rate K/Nmax is greater than the code rate threshold Rt, read Nmax×Rt rows and (Nmax−K) columns of the first matrix in the second direction from the preset code table to obtain a matrix Z23; read (K−Nmax×Rt) rows and (Nmax×K) columns adjacent to the matrix Z23 in a fourth direction from the preset code table to obtain a matrix Z24, where the fourth direction is opposite to the first direction; and combine the matrix Z23 and the matrix Z24 to obtain the fourth matrix.

In a possible implementation, the fourth reading unit is specifically configured to read K rows and (N−K) columns starting from the leftmost or the rightmost in the fourth matrix to obtain the fifth matrix.

In a possible implementation, when K is K1, the read second matrix is Z4; or when K is K2, the read second matrix is Z5; and
  if K1 is less than K2 and N of Z4 is the same as N of Z5, K1 rows and (N−K2) columns of Z4 in the second direction are consistent with K1 rows and (N−K2) columns of Z5 in the first direction.

In a possible implementation, when N is N1, the fifth matrix obtained by reading K rows and (N1−K) columns starting from the preset second location in the fourth matrix is Z6; or when N is N2, the fifth matrix obtained by reading K rows and (N2−K) columns starting from the preset second location in the fourth matrix is Z7; and
  if N1 is less than N2, K rows and (N1−K) columns of Z7 starting from the preset second location are consistent with Z6.

According to a fifth aspect, an embodiment of this application provides an encoding device, including a processor. The processor is configured to invoke a stored program to perform the following steps:
  when a first code rate K/Nmax is less than or equal to a code rate threshold Rt, reading a second matrix from a preset code table based on a first matrix, where the first matrix includes a matrix that is read from the preset code table and that corresponds to a maximum supported code length Nmax and Rt;
  reading K rows and (N−K) columns starting from a preset first location in the second matrix to obtain a third matrix; and
  adding a unit matrix with K rows and K columns to a left side of the third matrix to obtain a generator matrix of an (N, K) linear block code, where
  K rows and (Nmax−Nmax×Rt) columns of the first matrix in a first direction are consistent with K rows and (Nmax−Nmax×Rt) columns of the second matrix in a second direction.

In a possible implementation, the reading a second matrix from a preset code table based on a first matrix includes:
  reading K rows and (Nmax−Nmax×Rt) columns of the first matrix in the first direction from the preset code table to obtain a matrix Z21;
  reading K rows and (Nmax×Rt−K) columns adjacent to the matrix Z21 in a third direction from the preset code table to obtain a matrix Z22, where the third direction is opposite to the second direction; and
  combining the matrix Z21 and the matrix Z22 to obtain the second matrix.

In a possible implementation, the reading K rows and (N−K) columns starting from a preset first location in the second matrix to obtain a third matrix includes:
  reading K rows and (N−K) columns starting from the leftmost or the rightmost in the second matrix to obtain the third matrix.

In a possible implementation, the encoding method may further include:
  when the first code rate K/Nmax is greater than the code rate threshold Rt, reading a fourth matrix from the preset code table based on the first matrix;
  reading K rows and (N−K) columns starting from a preset second location in the fourth matrix to obtain a fifth matrix; and
  adding a unit matrix with K rows and K columns to a left side of the fifth matrix to obtain a generator matrix of an (N, K) linear block code, where
  Nmax×Rt rows and (Nmax−K) columns of the first matrix in the second direction are consistent with Nmax×Rt rows and (Nmax−K) columns of the fourth matrix in the first direction.

In a possible implementation, the reading a fourth matrix from the preset code table based on the first matrix includes:
  reading Nmax×Rt rows and (Nmax−K) columns of the first matrix in the second direction from the preset code table to obtain a matrix Z23;
  reading (K−Nmax×Rt) rows and (Nmax−K) columns adjacent to the matrix Z23 in a fourth direction from the preset code table to obtain a matrix Z24, where the fourth direction is opposite to the first direction; and
  combining the matrix Z23 and the matrix Z24 to obtain the fourth matrix.

In a possible implementation, the reading K rows and (N−K) columns starting from a preset second location in the fourth matrix to obtain a fifth matrix includes:
  reading K rows and (N−K) columns starting from the leftmost or the rightmost in the fourth matrix to obtain the fifth matrix.

In a possible implementation,
  the first direction is a topmost part of a matrix, and the second direction is a rightmost part of the matrix; or
  the first direction is a bottommost part of a matrix, and the second direction is a rightmost part of the matrix; or
  the first direction is a topmost part of a matrix, and the second direction is a leftmost part of the matrix; or
  the first direction is a bottommost part of a matrix, and the second direction is a leftmost part of the matrix.

In a possible implementation, when K is K1, the read second matrix is Z4; or when K is K2, the read second matrix is Z5; and
  if K1 is less than K2 and N of Z4 is the same as N of Z5, K1 rows and (N−K2) columns of Z4 in the second direction are consistent with K1 rows and (N−K2) columns of Z5 in the first direction.

In a possible implementation, when N is N1, the third matrix obtained by reading K rows and (N1−K) columns starting from the preset first location in the second matrix is Z6; or when N is N2, the third matrix obtained by reading K rows and (N2−K) columns starting from the preset first location in the second matrix is Z7; and
  if N1 is less than N2, K rows and (N1−K) columns of Z7 starting from the preset first location are consistent with Z6.

According to a sixth aspect, an embodiment of this application provides an encoding device, including a processor. The processor is configured to invoke a stored program to perform the following steps:

when a first code rate K/Nmax is greater than a code rate threshold Rt, reading a fourth matrix from a preset code table based on a first matrix, where the first matrix includes a matrix that is read from the preset code table and that corresponds to a maximum supported code length Nmax and Rt;

reading K rows and (N−K) columns starting from a preset second location in the fourth matrix to obtain a fifth matrix; and adding a unit matrix with K rows and K columns to a left side of the fifth matrix to obtain a generator matrix of an (N, K) linear block code, where Nmax×Rt rows and (Nmax−K) columns of the first matrix in a second direction are consistent with Nmax×Rt rows and (Nmax−K) columns of the fourth matrix in a first direction.

In a possible implementation, the reading a fourth matrix from a preset code table based on a first matrix includes:

reading Nmax×Rt rows and (Nmax−K) columns of the first matrix in the second direction from the preset code table to obtain a matrix Z23;

reading (K−Nmax×Rt) rows and (Nmax−K) columns adjacent to the matrix Z23 in a fourth direction from the preset code table to obtain a matrix Z24, where the fourth direction is opposite to the first direction; and combining the matrix Z23 and the matrix Z24 to obtain the fourth matrix.

In a possible implementation, the reading K rows and (N−K) columns starting from a preset second location in the fourth matrix to obtain a fifth matrix includes: reading K rows and (N−K) columns starting from the leftmost or the rightmost in the fourth matrix to obtain the fifth matrix.

In a possible implementation, when K is K1, the read second matrix is Z4; or when K is K2, the read second matrix is Z5; and if K1 is less than K2 and N of Z4 is the same as N of Z5, K1 rows and (N−K2) columns of Z4 in the second direction are consistent with K1 rows and (N−K2) columns of Z5 in the first direction.

In a possible implementation, when N is N1, the fifth matrix obtained by reading K rows and (N1−K) columns starting from the preset second location in the fourth matrix is Z6; or when N is N2, the fifth matrix obtained by reading K rows and (N2−K) columns starting from the preset second location in the fourth matrix is Z7; and if N1 is less than N2, K rows and (N1−K) columns of Z7 starting from the preset second location are consistent with Z6.

According to a seventh aspect, an embodiment of this application provides a computer-readable storage medium. The computer-readable storage medium stores a program, and the program includes instructions used to perform some or all steps of any method according to the first aspect.

According to an eighth aspect, an embodiment of this application provides a computer program product. When the computer program product runs on a computer, the computer is enabled to perform some or all steps of any method according to the first aspect.

It should be understood that the technical solutions in the second aspect to the fifth aspect of this application are consistent with the technical solution in the first aspect. Beneficial effects achieved in the various aspects and corresponding feasible implementations are similar, and details are not described again.

BRIEF DESCRIPTION OF DRAWINGS

To describe technical solutions in embodiments of this application more clearly, the following describes the accompanying drawings for describing the embodiments of this application.

FIGS. 6A-B are schematic diagrams of a preset code table according to an embodiment of this application;

FIG. 7 is a schematic diagram of a preset code table according to another embodiment of this application;

DESCRIPTION OF EMBODIMENTS

The following describes the embodiments of this application with reference to the accompanying drawings in the embodiments of this application.

Figure 1A:
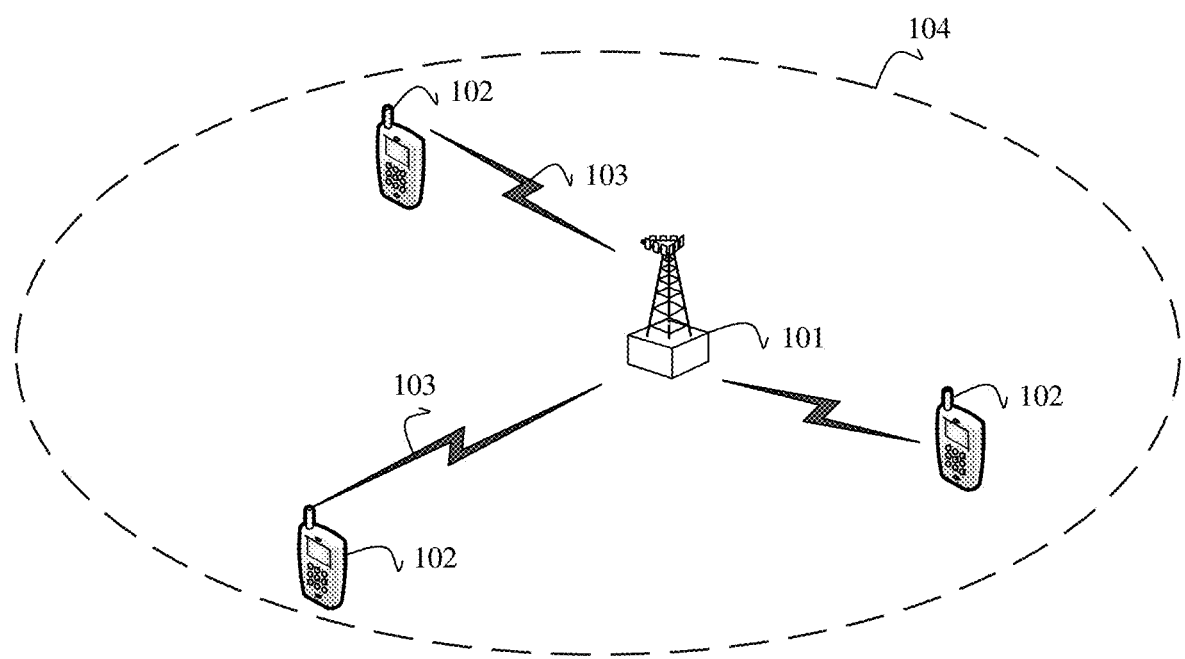
FIG. 1a is a schematic diagram of a communications system according to an embodiment of this application.

FIG. 1a is a schematic diagram of a communications system according to an embodiment of this application. The communications system 100 may include at least one network device 101 (only one network device is shown in the diagram) and one or more terminal devices 102 connected to the network device 101.

The network device 101 may perform wireless communication with the terminal device 102 by using one or more antennas. Each network device 101 can provide communication coverage for a coverage area 104 corresponding to the network device 101. The coverage area 104 corresponding to the network device 101 may be divided into a plurality of sectors (sectors). One sector corresponds to a portion of the coverage area (not shown). When the communications system 100 includes a core network, the network device 101 may also be connected to the core network.

Figure 1B:
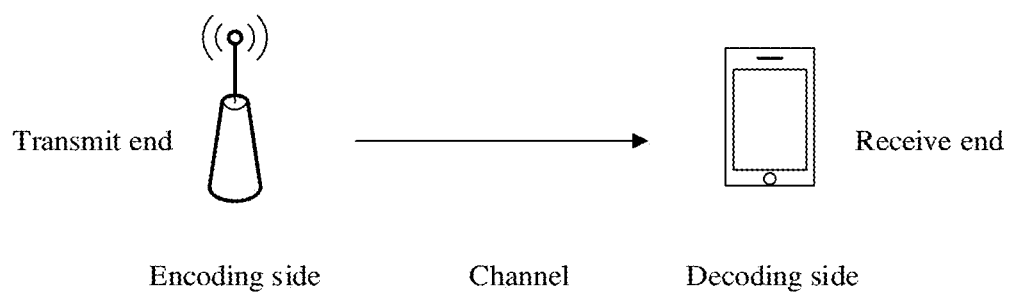
FIG. 1b is a schematic diagram of a system including a transmit end and a receive end according to an embodiment of this application.

When the network device 101 or the terminal device 102 sends information or data, an encoding method described in the embodiments of this application may be used. Therefore, for convenience of description, in this embodiment of this application, the communications system 100 is simplified as a system including a transmit end 101 and a receive end 102, as shown in FIG. 1b. The transmit end may be the network device 101, and the receive end is the terminal device 102; or the transmit end is the terminal device 102, and the receive end is the network device 101.

In this embodiment of this application, the network device 101 may include a base transceiver station (base transceiver station), a wireless transceiver, one basic service set (basic service set, BSS), one extended service set (extended service set, ESS), a NodeB (NodeB), an evolved NodeB (evolved NodeB, eNB or eNodeB), a next-generation NodeB (next-generation NodeB, gNB), or the like. The communications system 100 may include several different types of network devices 101, for example, a macro base station (macro base station) and a micro base station (micro base station). The network device 101 may be alternatively a small cell, a transmission/reception point (transmission/reception point, TRP), or the like. The network device 101 may use different wireless technologies, for example, a cell radio access technology or a WLAN radio access technology.

In this embodiment of this application, the terminal device 102 is a device having a wireless transceiver function, and may be deployed on land, including an indoor device or an outdoor device, a handheld device, a wearable device, or a vehicle-mounted device. The terminal device 102 may alternatively be deployed on water (for example, on a ship) or in the air (for example, on an airplane, a balloon, or a satellite). The terminal device may be a mobile phone (mobile phone), a tablet computer (pad), a computer having a wireless transceiver function, a virtual reality (virtual reality, VR) terminal device, an augmented reality (augmented reality, AR) terminal device, a wireless terminal in industrial control (industrial control), a wireless terminal in self driving (self driving), a wireless terminal in telemedicine (telemedicine), a wireless terminal in a smart grid (smart grid), a wireless terminal in transportation safety (transportation safety), a wireless terminal in a smart city (smart city), a wireless terminal in a smart home (smart home), or the like. Application scenarios are not limited in the embodiments of this application. Sometimes, the terminal device may also be referred to as user equipment (user equipment, UE), a terminal (terminal), an access terminal, a UE unit, a UE station, a mobile device, a mobile station (mobile station), a mobile terminal, a mobile client, a mobile unit (mobile unit), a remote station, a remote terminal device, a remote unit, a wireless unit, a wireless communications device, a user agent, a user apparatus, or the like.

It should be noted that, terms "system" and "network" in the embodiments of this application may be used interchangeably. A plurality of means two or more. In view of this, "a plurality of" may also be understood as "at least two" in the embodiments of this application. The term "and/or" describes an association relationship between associated objects and indicates that three relationships may exist. For example, A and/or B may indicate the following three cases: Only A exists, both A and B exist, and only B exists. In addition, unless otherwise specified, the character "/" generally indicates an "or" relationship between associated objects.

Figure 2:
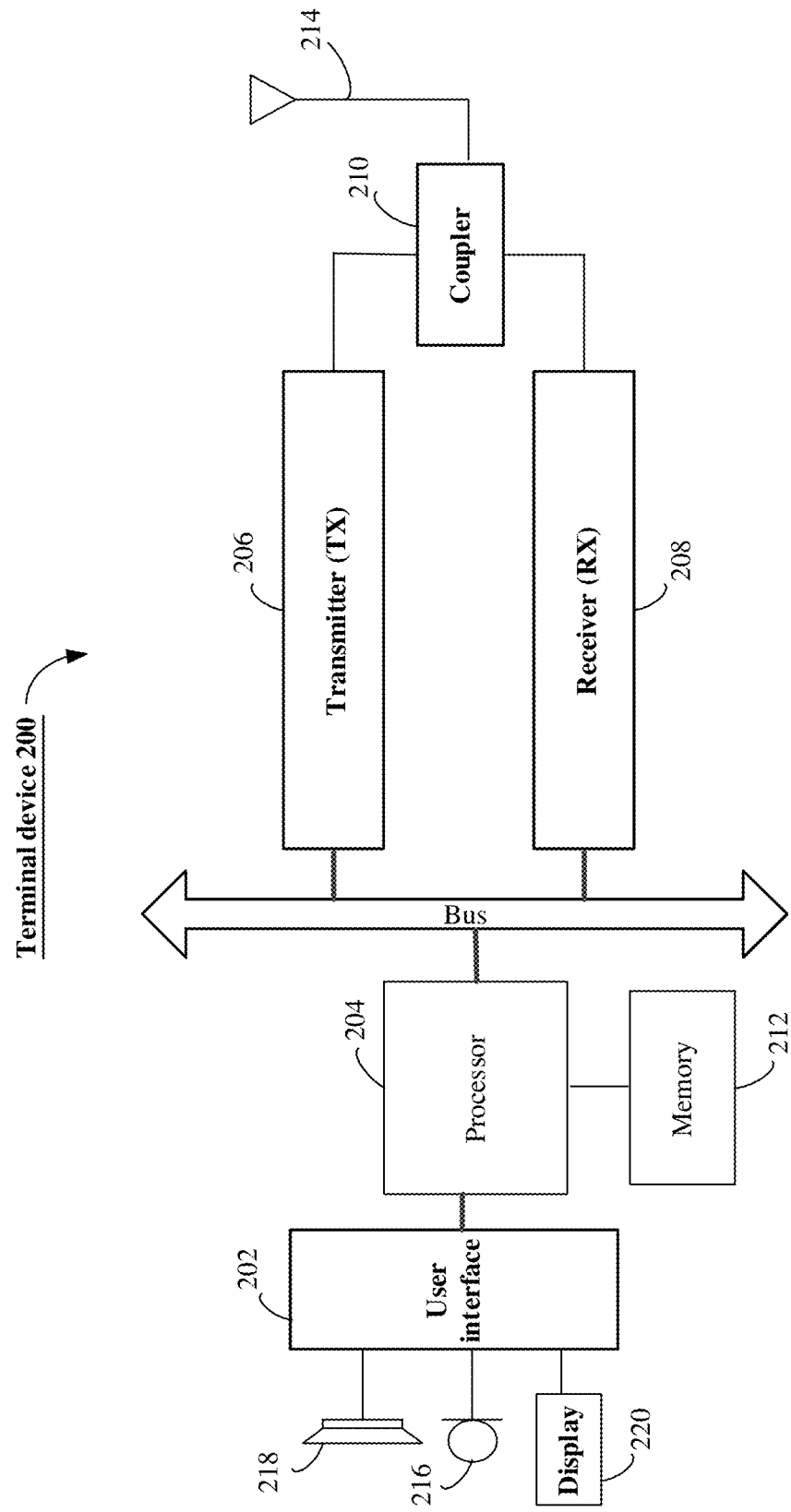
FIG. 2 is a schematic diagram depicting a structure of a terminal device according to an embodiment of this application.

FIG. 2 shows a terminal device according to an embodiment of this application. As shown in FIG. 2, the terminal device 200 may include an input/output module (including an audio input/output module 218, a key input module 216, a display 220, and the like), a user interface 202, one or more processors 204, a transmitter 206, a receiver 208, a coupler 210, an antenna 214, and a memory 212. These components may be connected through a bus or in another manner. In FIG. 2, an example in which the components are connected through the bus is used.

The antenna 214 may be configured to convert electromagnetic energy into electromagnetic waves in free space, or convert electromagnetic waves in free space into electromagnetic energy in a transmission line. The coupler 210 is configured to split a mobile communication signal received by the antenna 214 into a plurality of signals, and allocate the plurality of signals to a plurality of receivers 208.

The transmitter 206 may be configured to perform transmission processing on a signal output by the processor 204.

The receiver 208 may be configured to perform reception processing on the mobile communication signal received by the antenna 214.

In this embodiment of this application, the transmitter 206 and the receiver 208 may be considered as a wireless modem. The terminal device 200 may include one or more transmitters 206 and one or more receivers 208.

In addition to the transmitter 206 and the receiver 208 shown in FIG. 2, the terminal device 200 may further include another communications component, for example, a GPS module, a Bluetooth (Bluetooth) module, or a wireless fidelity (wireless fidelity, Wi-Fi) module. Not limited to the foregoing wireless communication signal, the terminal device 200 may further support another wireless communication signal, for example, a satellite signal or a short-wave signal. Not limited to wireless communication, the terminal device 200 may further support wired communication by having a wired network interface (for example, a LAN interface) 201.

The input/output module may be configured to implement interaction between the terminal device 200 and a user/an external environment, and may mainly include the audio input/output module 218, the key input module 216, the display 220, and the like. Specifically, the input/output module may further include a camera, a touchscreen, a sensor, and the like. All the input/output modules communicate with the processor 204 through the user interface 202.

The memory 212 may be coupled to the processor 204 through the bus or an input/output port, or the memory 212 may be integrated with the processor 204. The memory 212 is configured to store various software programs and/or a plurality of groups of instructions. Specifically, the memory 212 may include a high-speed random access memory, and may also include a nonvolatile memory, for example, one or more magnetic disk storage devices, a flash memory device, or another nonvolatile solid-state storage device. The memory 212 may store an operating system (referred to as a system below), for example, an embedded operating system such as Android, iOS, Windows, or Linux. The memory 212 may further store a network communications program. The network communications program may be used to communicate with one or more additional devices, one or more terminal devices, and one or more network devices. The memory 212 may further store a user interface program. The user interface program may vividly display content of an application by using a graphical operating window, and receive, by using an input control such as a menu, a dialog box, or a key, a control operation performed by a user on the application.

In this embodiment of this application, the memory 212 may be configured to store an implementation program, on a side of the terminal device 200, of an encoding method provided in one or more embodiments of this application. For implementation of the encoding method provided in one or more embodiments of this application, refer to the following embodiments.

The processor 204 may be configured to read and execute computer-readable instructions. Specifically, the processor 204 may be configured to invoke a program stored in the memory 212, for example, the implementation program, on the side of the terminal device 200, of the encoding method provided in one or more embodiments of this application, and execute instructions included in the program to implement the method in a subsequent embodiment. The processor 204 may support one or more of global system for mobile communications (global system for mobile communications, GSM) (2G) communication, wideband code division multiple access (wideband code division multiple access, WCDMA) (3G) communication, long term evolution (long term evolution, LTE) (4G) communication, 5G communication, and the like. Optionally, the processor 204 specifically drives or controls the transmitter 206 to send any message or data. Optionally, the processor 204 specifically drives or controls the receiver 208 to receive any message or data. Therefore, the processor 204 may be considered as a control center for performing sending or reception, and the transmitter 206 and the receiver 208 are specific executors of sending and reception operations.

It may be understood that the terminal device 200 may be the terminal device 102 in the communications system 100 shown in FIG. 1a, and may be implemented as user equipment (user equipment, UE), a terminal (terminal), an access terminal, a UE unit, a UE station, a mobile device, a mobile station (mobile station), a mobile terminal, or the like.

It should be noted that the terminal device 200 shown in FIG. 2 is merely an implementation of the embodiments of this application, and in actual application, the terminal device 200 may further include more or fewer components. This is not limited herein.

Figure 3:
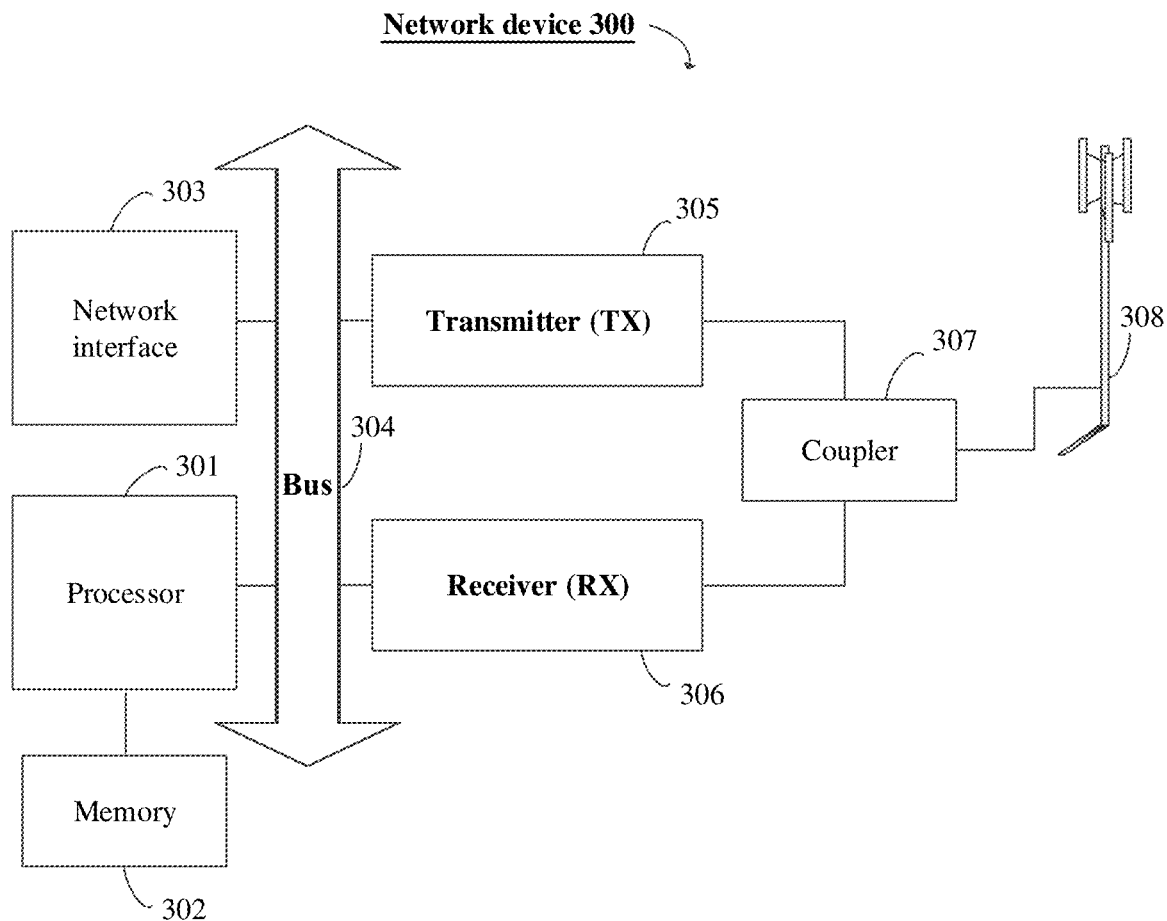
FIG. 3 is a schematic diagram depicting a structure of a network device according to an embodiment of this application.

FIG. 3 shows a network device according to an embodiment of this application. As shown in FIG. 3, the network device 300 may include one or more processors 301, a memory 302, a network interface 303, a transmitter 305, a receiver 306, a coupler 307, and an antenna 308. These components may be connected through a bus 304 or in another manner. In FIG. 3, an example in which the components are connected through the bus is used.

The network interface 303 may be used by the network device 300 for communicating with another communications device, for example, another network device. Specifically, the network interface 303 may be a wired interface.

The transmitter 305 may be configured to perform transmission processing, for example, signal modulation, on a signal output by the processor 301. The receiver 306 may be configured to perform reception processing, for example, signal demodulation, on a mobile communication signal received by the antenna 308. In some embodiments of this application, the transmitter 305 and the receiver 306 may be considered as a wireless modem. The network device 300 may include one or more transmitters 305 and one or more receivers 306. The antenna 308 may be configured to convert electromagnetic energy in a transmission line into electromagnetic waves in free space, or convert electromagnetic waves in free space into electromagnetic energy in a transmission line. The coupler 307 may be configured to divide a mobile communication signal into a plurality of signals, and allocate the plurality of signals to a plurality of receivers 306.

The memory 302 may be coupled to the processor 301 through the bus 304 or an input/output port, or the memory 302 may be integrated with the processor 301. The memory 302 is configured to store various software programs and/or a plurality of groups of instructions. Specifically, the memory 302 may include a high-speed random access memory, and may also include a nonvolatile memory, for example, one or more disk storage devices, a flash memory device, or another nonvolatile solid-state storage device. The memory 302 may store an operating system (referred to as a system below), for example, an embedded operating system such as uCOS, VxWorks, or RTLinux. The memory 302 may further store a network communications program. The network communications program may be used to communicate with one or more additional devices, one or more terminal devices, and one or more network devices.

The processor 301 may be configured to: perform radio channel management, calling implementation, and communications link establishment and disconnecting; and provide cell handover control and the like for a user in a local control area. Specifically, the processor 301 may include an administration/communication module (administration module/communication module, AM/CM) (a center for speech channel switching and information exchange), a basic module (basic module, BM) (configured to implement call processing, signaling processing, radio resource management, radio link management, and circuit maintenance functions), a transcoder and submultiplexer (transcoder and submultiplexer, TCSM) (configured to implement multiplexing/demultiplexing and transcoding functions), and the like.

In this embodiment of this application, the processor 301 may be configured to read and execute computer-readable instructions. Specifically, the processor 301 may be configured to invoke a program stored in the memory 302, for example, an implementation program, on a side of the network device 300, of the encoding method provided in one or more embodiments of this application, and execute instructions included in the program.

It may be understood that the network device 300 may be the network device 101 in the communications system 100 shown in FIG. 1a, and may be implemented as a base station, a wireless transceiver, a basic service set (BSS), an extended service set (ESS), a NodeB, an eNodeB, a gNB, or the like.

It should be noted that the network device 300 shown in FIG. 3 is merely an implementation of the embodiments of this application, and in actual application, the network device 300 may further include more or fewer components. This is not limited herein.

It should be noted that a receiving apparatus described in the following embodiments may be the foregoing terminal device, and a sending apparatus may be the foregoing network device; or a receiving apparatus described in the following embodiments may be the foregoing network device, and a sending apparatus may be the foregoing terminal device.

Figure 4:
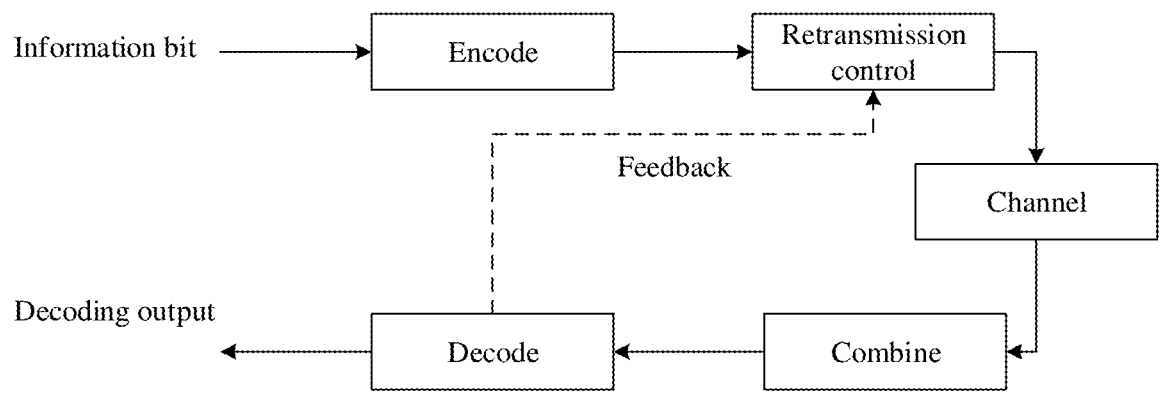
FIG. 4 is a schematic diagram of a HARQ principle according to an embodiment of this application.

FIG. 4 is a schematic diagram of a HARQ principle according to an embodiment of this application. After receiving data, a receive end first decodes the data, and then determines, through CRC, whether the received data is correct. If the received data is correct, the receive end returns ACK information to a transmit end to notify the transmit end that the current reception is correct. If the CRC fails, the receive end considers that the current data reception is incorrect, and the receive end feeds back or returns NACK information to the transmit end to notify the transmit end that the current reception is incorrect, so that the transmit end performs retransmission. After receiving retransmitted information, the receive end combines the previous information and the retransmitted information, and then continues to perform decoding and perform CRC to determine whether the information is correct.

According to the encoding method provided in the embodiments of this application, a linear block code with a nested structure is obtained, and a linear block code with a nested structure that is obtained through search has relatively fine performance Therefore, when decoding is performed by using the linear block code with a nested structure in the embodiments of this application, the nested structure is conducive to implementing HARQ.

Figure 5:
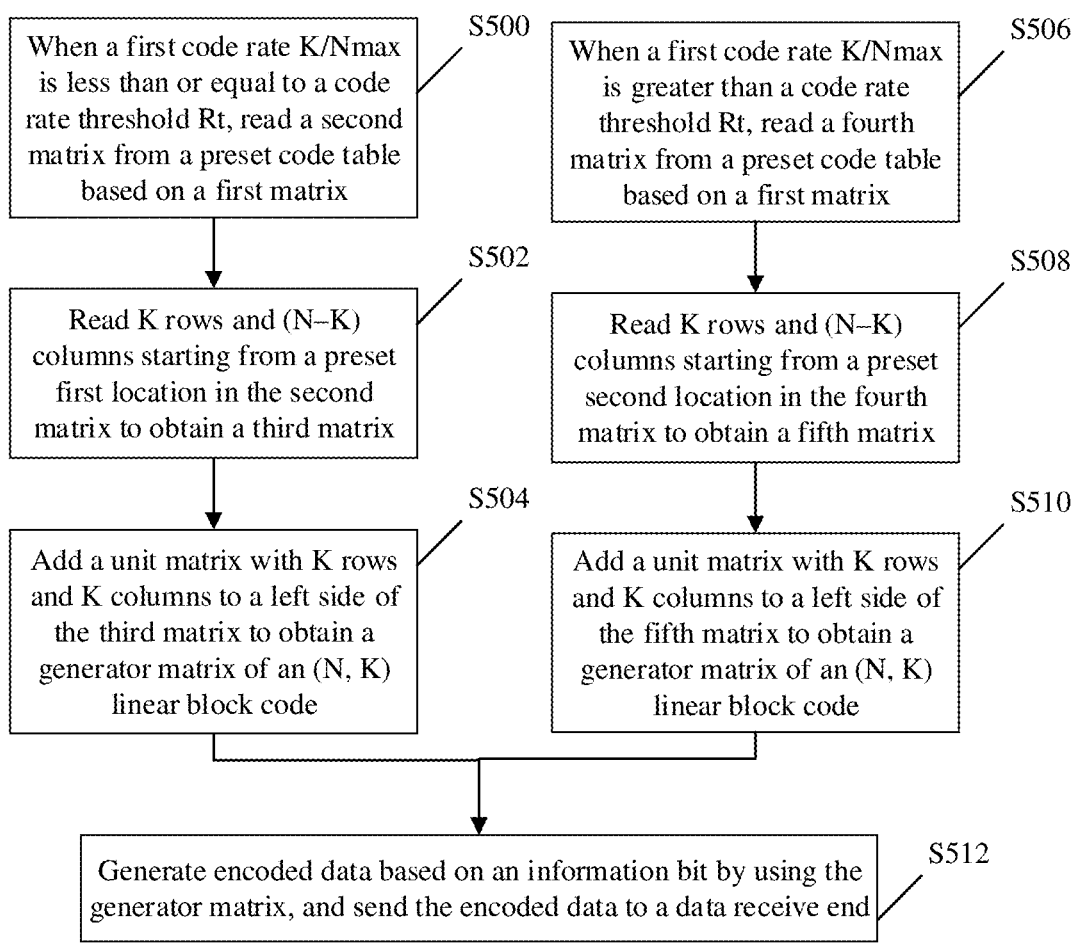
FIG. 5 is a schematic flowchart of an encoding method according to an embodiment of this application.

With reference to a schematic flowchart, shown in FIG. 5, of an encoding method provided in an embodiment of this application, the following describes how a transmit end performs encoding in this embodiment of this application. The method includes the following steps.

Step S500: When a first code rate $K/N_{max}$ is less than or equal to a code rate threshold Rt, read a second matrix from a preset code table based on a first matrix.

Specifically, the first matrix includes a matrix that is read from the preset code table T and that corresponds to a maximum supported code length $N_{max}$ and Rt. The code table T may be a fixed code table generated in advance by using a search method. In other words, the preset fixed code table is used to read the second matrix each time encoding is subsequently performed.

In this embodiment of this application, there is a nested relationship between the read second matrix and the first matrix. To be specific, K rows and ($N_{max}-N_{max} \times Rt$) columns of the first matrix in a first direction are consistent with K rows and ($N_{max}-N_{max} \times Rt$) columns of the second matrix in a second direction.

In addition, when N remains unchanged, there is also a nested relationship between different second matrices read each time. To be specific, when K is K1, the read second matrix is Z4; or when K is K2, the read second matrix is Z5; and if K1 is less than K2 and N of Z4 is the same as N of Z5, K1 rows and (N-K2) columns of Z4 in the second direction are consistent with K1 rows and (N-K2) columns of Z5 in the first direction.

In an implementation, step S500 may include: reading K rows and ($N_{max}-N_{max} \times Rt$) columns of the first matrix in the first direction from the preset code table to obtain a matrix Z21; reading K rows and ($N_{max} \times Rt-K$) columns adjacent to the matrix Z21 in a third direction from the preset code table to obtain a matrix Z22, where the third direction is opposite to the second direction; and combining the matrix Z21 and the matrix Z22 to obtain the second matrix.

Step S502: Read K rows and (N−K) columns starting from a preset first location in the second matrix to obtain a third matrix.

Specifically, in this embodiment of this application, the preset first location in the second matrix may be the leftmost, the rightmost, or a column (for example, the second column, the third column, the second to last column, or the third to last column) in the second matrix, provided that K rows and (N−K) columns can be read. In addition, after the preset first location is determined, K rows and (N−K) columns are read starting from the preset first location in the second matrix each time.

For example, if a second matrix is 12 rows and 20 columns, and 12 rows and 13 columns need to be read from the second matrix to obtain a third matrix, 12 rows and 13 columns may be read toward the right starting from the leftmost in the second matrix, 12 rows and 13 columns may be read toward the left starting from the rightmost in the second matrix, 12 rows and 13 columns may be read toward the right starting from the second column of the second matrix, or 12 rows and 11 columns may be read toward the right from the tenth column of the second matrix and then 12 rows and 2 columns may be read starting from the first column of the second matrix (in other words, the first column is read after the last column is read) to obtain 12 rows and 13 columns Another example is not described.

When K remains unchanged, there is also a nested relationship between different third matrices read each time in the manner in this embodiment of this application. For example, when N is N1, the third matrix obtained by reading K rows and (N1−K) columns starting from the preset first location in the second matrix is Z6; or when N is N2, the third matrix obtained by reading K rows and (N2−K) columns starting from the preset first location in the second matrix is Z7; and if N1 is less than N2, K rows and (N1−K) columns of Z7 starting from the preset first location are consistent with Z6.

Therefore, according to the encoding method in this embodiment of this application, incremental HARQ can be supported. When a quantity of sent information bits remains unchanged (K remains unchanged), if previous decoding (for example, the previous decoding of (30, 12)) fails, a receive end feeds back information about a decoding failure to the transmit end. If the transmit end sends a (32, 12) linear block code by using the encoding method in this embodiment of this application, the transmit end only needs to send an incremental part (that is, incremental 12 rows and 2 columns) obtained after a code length becomes larger. After receiving the incremental part, the receive end may decode the previous reception result and the incremental part together.

Step S504: Add a unit matrix with K rows and K columns to a left side of the third matrix to obtain a generator matrix of an (N, K) linear block code.

The linear block code may be represented by a generator matrix. For example, a linear block code with a code length N and an information bit K may be represented by a generator matrix of K rows and N columns. In addition, the generator matrix of the linear block code may be written in a form of a system. To be specific, the generator matrix of the linear block code is converted into a system generator matrix by using a row transformation (including row interleaving and row modulo-2 addition) method. The system generator matrix may be written into a combination of a unit matrix (K rows and K columns) and K rows and (N−K) columns. In this embodiment of this application, a matrix of K rows and (N−K) columns in the system generator matrix is referred to as a matrix Z, and after the matrix Z is determined, the generator matrix of the (N, K) code is also determined.

Step S506: When the first code rate K/Nmax is greater than the code rate threshold Rt, read a fourth matrix from the preset code table based on the first matrix.

Specifically, in this embodiment of this application, there is a nested relationship between the read fourth matrix and the first matrix. To be specific, Nmax×Rt rows and (Nmax−K) columns of the first matrix in the second direction are consistent with Nmax×Rt rows and (Nmax−K) columns of the fourth matrix in the first direction.

In addition, when N remains unchanged, there is also a nested relationship between different fourth matrices read each time. To be specific, when K is K1, the read fourth matrix is Z4; or when K is K2, the read fourth matrix is Z5; and if K1 is less than K2 and N of Z4 is the same as N of Z5, K1 rows and (N−K2) columns of Z4 in the second direction are consistent with K1 rows and (N−K2) columns of Z5 in the first direction.

In an implementation, step S506 may include: reading Nmax×Rt rows and (Nmax−K) columns of the first matrix in the second direction from the preset code table to obtain a matrix Z23; reading (K−Nmax×Rt) rows and (Nmax−K) columns adjacent to the matrix Z23 in a fourth direction from the preset code table to obtain a matrix Z24, where the fourth direction is opposite to the first direction; and combining the matrix Z23 and the matrix Z24 to obtain the fourth matrix.

Step S508: Read K rows and (N−K) columns starting from a preset second location in the fourth matrix to obtain a fifth matrix.

Specifically, in this embodiment of this application, the preset second location in the fourth matrix may be the leftmost, the rightmost, or a column (for example, the second column, the third column, the second to last column, or the third to last column) in the fourth matrix, provided that K rows and (N−K) columns can be read. In addition, after the preset second location is determined, K rows and (N−K) columns are read starting from the preset second location in the fourth matrix each time.

For example, if a fourth matrix has 12 rows and 20 columns, and 12 rows and 13 columns need to be read from the fourth matrix to obtain a fifth matrix, 12 rows and 13 columns may be read toward the right starting from the leftmost in the fourth matrix, 12 rows and 13 columns may be read toward the left starting from the rightmost in the fourth matrix, 12 rows and 13 columns may be read toward the right starting from the second column of the fourth matrix, or 12 rows and 11 columns may be read toward the right from the tenth column of the fourth matrix and then 12 rows and 2 columns may be read starting from the first column of the fourth matrix (in other words, the first column is read after the last column is read) to obtain 12 rows and 13 columns. Another example is not described.

When K remains unchanged, there is also a nested relationship between different fifth matrices read each time in the manner in this embodiment of this application. For example, when N is N1, the fifth matrix obtained by reading K rows and (N1−K) columns starting from the preset second location in the fourth matrix is Z6; or when N is N2, the fifth matrix obtained by reading K rows and (N2−K) columns starting from the preset second location in the fourth matrix is Z7; and if N1 is less than N2, K rows and (N1−K) columns of Z7 starting from the preset second location are consistent with Z6.

Therefore, according to the encoding method in this embodiment of this application, incremental HARQ can be supported. When a quantity of sent information bits remains unchanged (K remains unchanged), if previous decoding (for example, the previous decoding of (30, 12)) fails, the receive end feeds back information about a decoding failure to the transmit end. If the transmit end sends a (32, 12) linear block code by using the encoding method in this embodiment of this application, the transmit end only needs to send an incremental part (that is, incremental 12 rows and 2 columns) obtained after a code length becomes larger. After receiving the incremental part, the receive end may decode the previous reception result and the incremental part together.

Step S510: Add a unit matrix with K rows and K columns to a left side of the fifth matrix to obtain a generator matrix of an (N, K) linear block code.

Step S512: Generate encoded data based on an information bit by using the generator matrix, and send the encoded data to the data receive end.

Specifically, after the to-be-encoded information bit is encoded by using the generator matrix of the linear block code with a nested relationship that is obtained in this embodiment of this application, an encoded information bit is sent to the data receive end.

According to the encoding method in this embodiment of this application, the obtained linear block code has a nested structure, supports incremental HARQ, and has advantages over a conventional technology in terms of a Hamming distance and performance. In addition, the nested structure of the linear block code can be constantly expanded, encoding is more flexible, and a work range may be unlimited. This resolves technical problems in the conventional technology that a work range of an LTE-RM code is quite limited and the LTE-RM code has poor performance and does not support incremental HARQ when an information vector length is less than or equal to 5.

In this embodiment of this application, the first direction may be a topmost part of a matrix, and the second direction may be a rightmost part of the matrix; or the first direction may be a bottommost part of a matrix, and the second direction may be a rightmost part of the matrix; or the first direction may be a topmost part of a matrix, and the second direction may be a leftmost part of the matrix; or the first direction may be a bottommost part of a matrix, and the second direction may be a leftmost part of the matrix. This embodiment of this application is not limited to the foregoing four cases, provided that a read matrix meets the nested relationship described in the embodiment of FIG. 5.

The following uses four embodiments as examples to describe an implementation process of step S500 to step S512.

Embodiment 1 (The first direction is a topmost part of a matrix, and the second direction is a rightmost part of the matrix):

Step 1: Read, from a preset code table T, a matrix (namely, a first matrix), namely, a matrix Z1, corresponding to a maximum supported code length Nmax and a code rate threshold Rt. The code rate threshold Rt is a code rate boundary value in a nested relationship in this embodiment of this application.

Figure 6A:
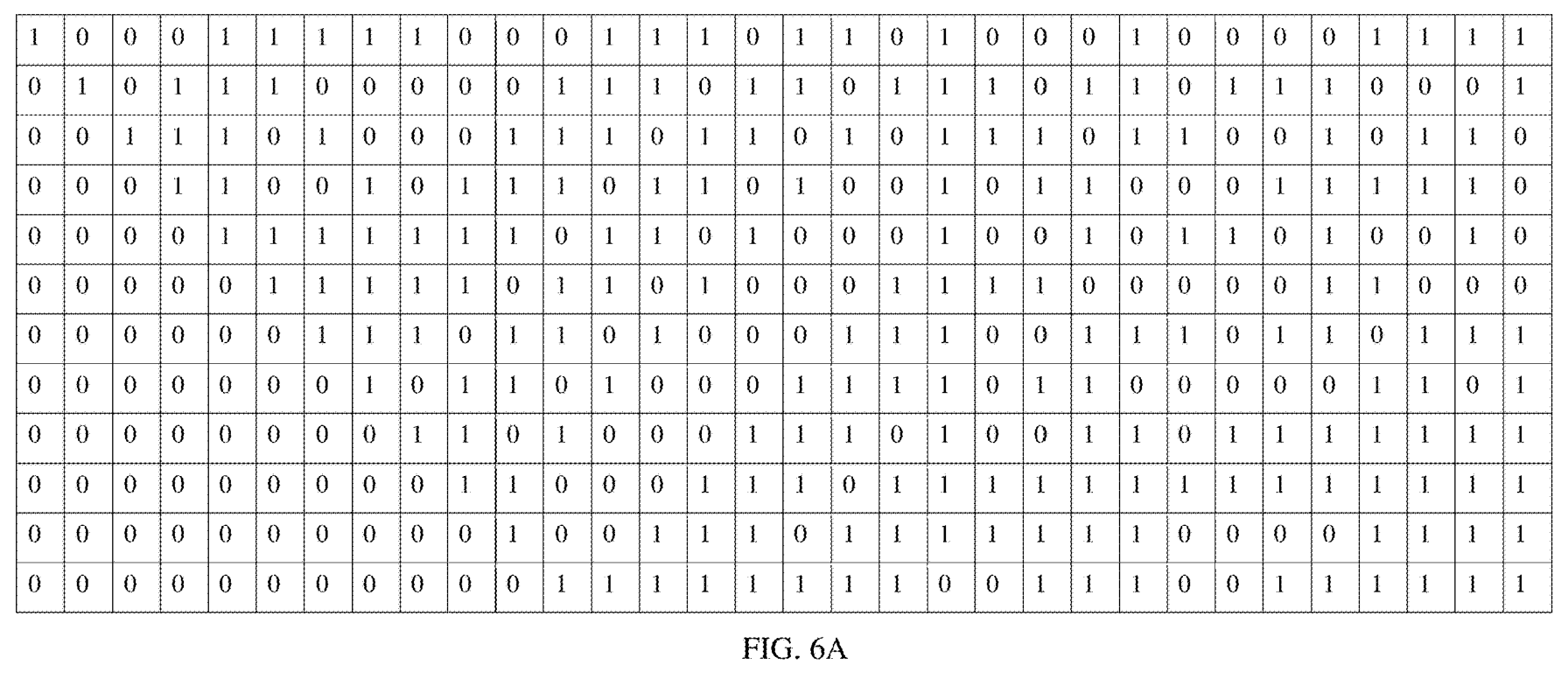
Figure 6B:
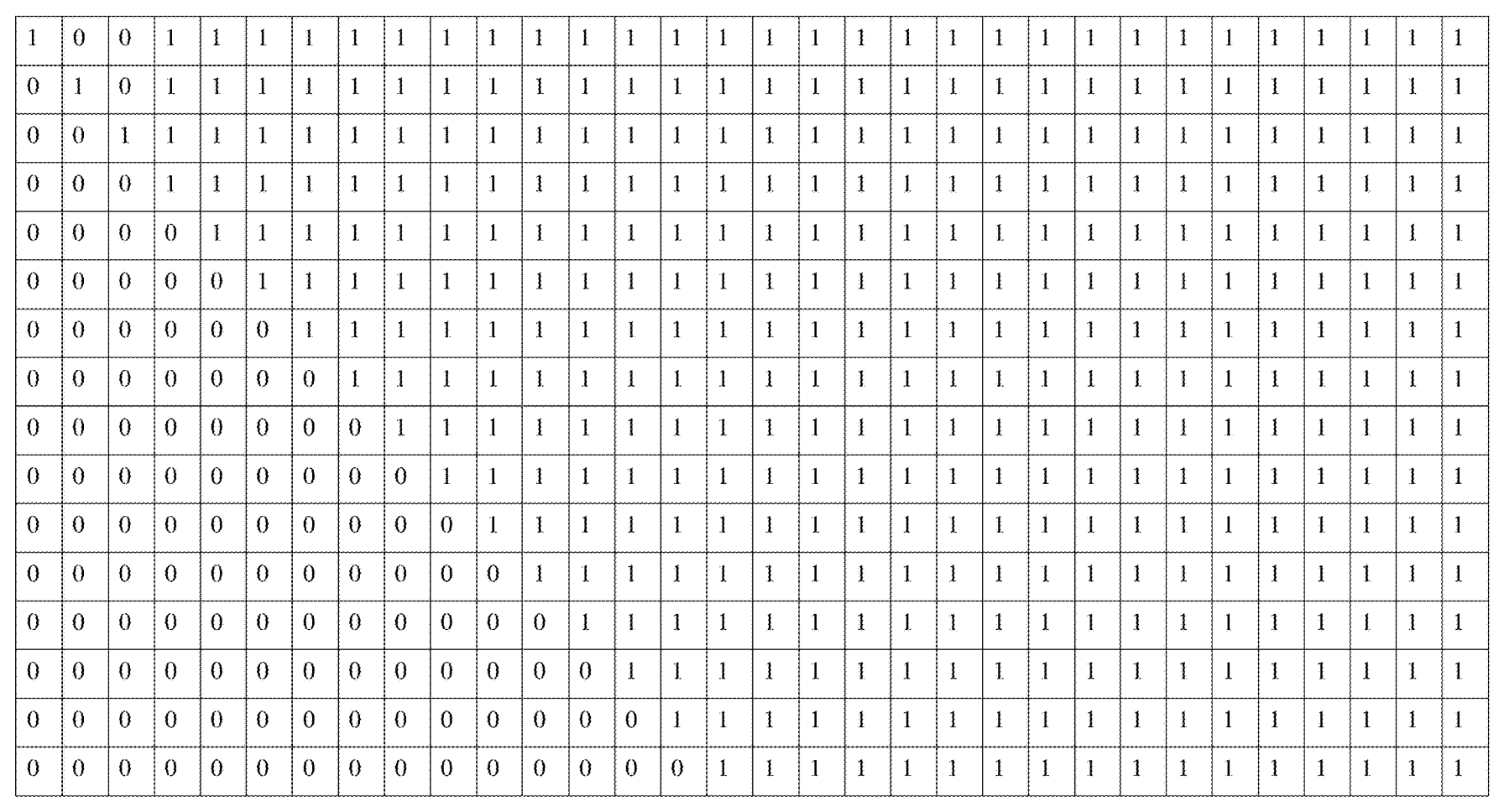
Figure 7:
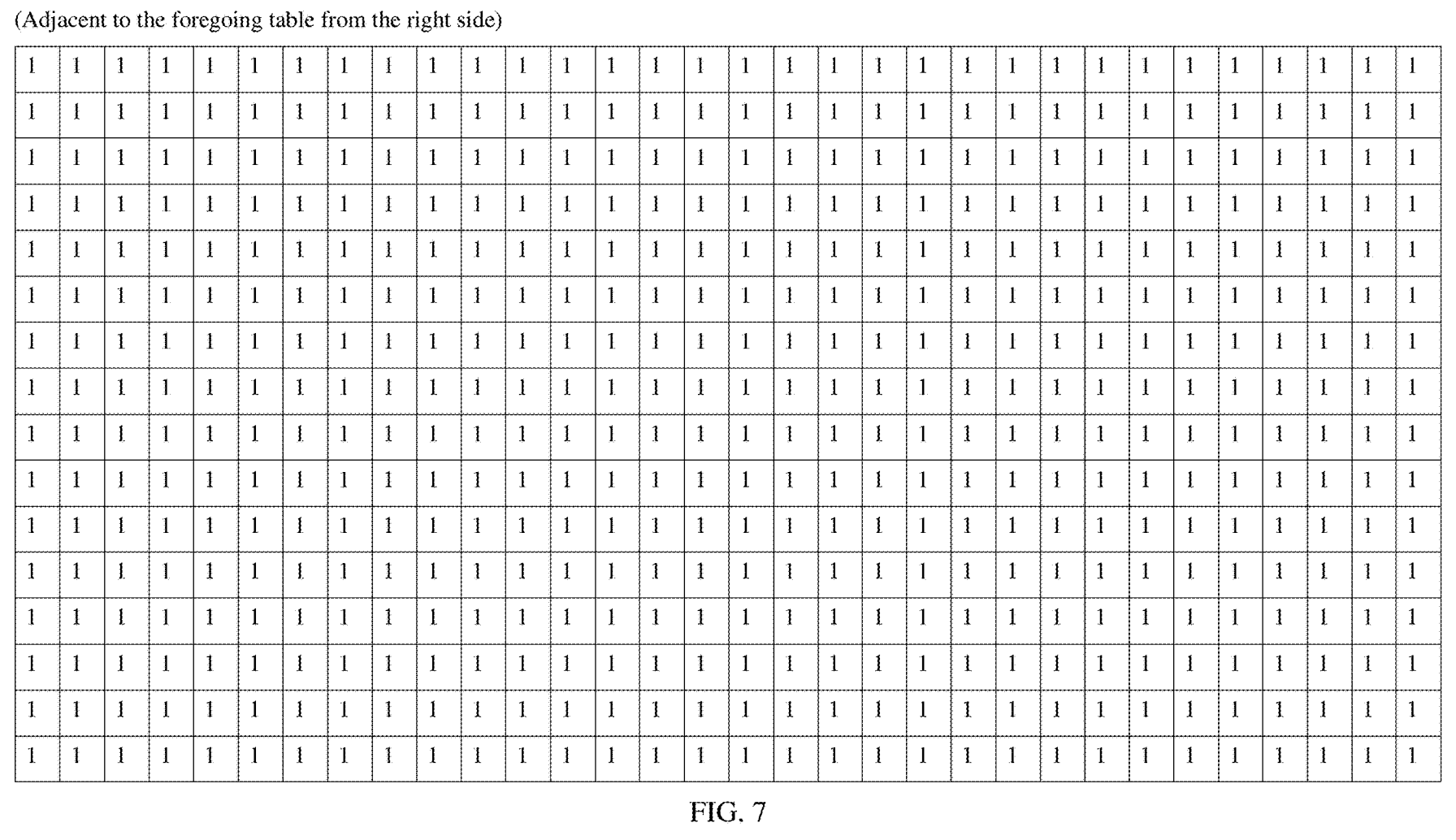

A specific code table T may be shown in schematic diagrams, shown in FIGS. 6A-B, of a preset code table provided in an embodiment of this application. The table in FIG. 6A-describe a code supporting maximum nesting of K=12 and N=32. Alternatively, a specific code table T may be shown in a schematic diagram of a preset code table provided in another embodiment of this application shown in FIG. 7. The table in FIG. 7 describes a code supporting maximum nesting of K=16 and N=64. For different (N, K)

codes, reading a matrix based on a manner provided in this embodiment of this application can meet a nesting feature.

Specifically, in this embodiment of this application, Z1 is read starting from an upper right corner of T. For example, the last column of Z1 is the last column of T, and the first row of Z1 is the first row of T.

Step 2: Determine a value of a first code rate K/Nmax.

When K/Nmax is less than or equal to the code rate threshold Rt, K rows and (Nmax−Nmax×Rt) columns at a topmost location of Z1 in T are read and denoted as Z21, K rows and (Nmax×Rt−K) columns adjacent to a left-side location of Z21 in T are read and denoted as Z22, and Z22 and Z21 are combined to obtain [Z22 Z21], that is, Z22 is on the left of Z21, so that [Z22 Z21] is used as a matrix, denoted as Z2 (namely, a second matrix), of an (Nmax, K) code. In other words, when K/Nmax is less than or equal to the code rate threshold Rt, K rows and (Nmax−Nmax×Rt) columns in a topmost part of Z1 are consistent with K rows and (Nmax−Nmax×Rt) columns in a rightmost part of Z2.

When K/Nmax is greater than the code rate threshold Rt, Nmax×Rt rows and (Nmax−K) columns at a rightmost location of Z1 in T are read and denoted as Z23, (K−Nmax×Rt) rows and (Nmax−K) columns adjacent to a lower location of Z23 in T are read and denoted as Z24, and Z23 and Z24 are combined, where Z23 is above Z24, to obtain a matrix used as a matrix, denoted as Z2 (namely, a fourth matrix), of an (Nmax, K) code. In other words, when K/Nmax is greater than the code rate threshold Rt, Nmax×Rt rows and (Nmax−K) columns in a rightmost part of Z1 are consistent with Nmax×Rt rows and (Nmax−K) columns in a topmost part of Z2.

Figure 8:
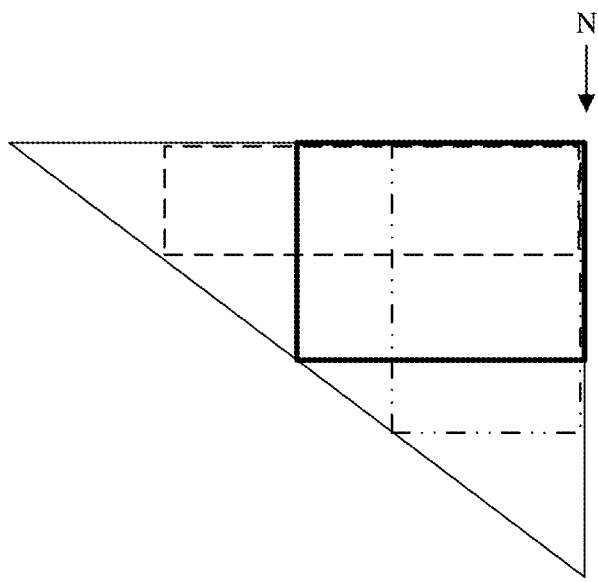
FIG. 8 is a schematic diagram of a principle of matrix reading according to an embodiment of this application.

FIG. 8 is a schematic diagram of a principle of matrix reading according to an embodiment of this application. In other words, a code that is encoded by using a code table and that supports incremental HARQ in this embodiment of this application may be stored in a form of a triangle shown in FIG. 8. However, the storing form is not limited to a triangle in this application. For example, the code may be alternatively represented by a rectangle, or each (N, K) code is separately stored, provided that the nesting feature in this patent application is met.

According to this embodiment of this application, Z2 is read from Z1, and when N remains unchanged, there is a nested relationship between different second matrices read each time. To be specific, when K is K1, the read second matrix is Z4; or when K is K2, the read second matrix is Z5; and if K1 is less than K2 and N of Z4 is the same as N of Z5, K1 rows and (N−K2) columns in a rightmost part of Z4 are consistent with K1 rows and (N−K2) columns in a topmost part of Z5.

Step 3: Read K rows and (N−K) columns starting from a preset first location in Z2 to obtain a matrix Z3.

Specifically, after the preset first location is determined, K rows and (N−K) columns are read starting from the preset first location in the second matrix each time. Therefore, when K remains unchanged, there is also a nested relationship between different third matrices read each time in the manner in this embodiment of this application. For example, when N is N1, the third matrix obtained by reading K rows and (N1−K) columns starting from the preset first location in the second matrix is Z6; or when N is N2, the third matrix obtained by reading K rows and (N2−K) columns starting from the preset first location in the second matrix is Z7; and if N1 is less than N2, K rows and (N1−K) columns of Z7 starting from the preset first location are consistent with Z6.

Step 4: Add a unit matrix with K rows and K columns to a left side of the matrix Z3 to obtain a generator matrix of an (N, K) linear block code.

Embodiment 2 (The first direction is a bottommost part of a matrix, and the second direction is a rightmost part of the matrix):

Step 1: Read, from a preset code table T, a matrix (namely, a first matrix), namely, a matrix Z1, corresponding to a maximum supported code length Nmax and a code rate threshold Rt. The code rate threshold Rt is a code rate boundary value in a nested relationship in this embodiment of this application.

Specifically, in this embodiment of this application, Z1 is read starting from a lower right corner of T. For example, the last column of Z1 is the last column of T, and the last row of Z1 is the last row of T.

Step 2: Determine a value of a first code rate K/Nmax.

When K/Nmax is less than or equal to the code rate threshold Rt, K rows and (Nmax−Nmax×Rt) columns at a bottommost location of Z1 in T are read and denoted as Z21, K rows and (Nmax×Rt−K) columns adjacent to a left-side location of Z21 in T are read and denoted as Z22, and Z22 and Z21 are combined to obtain [Z22 Z21], that is, Z22 is on the left of Z21, so that [Z22 Z21] is used as a matrix, denoted as Z2 (namely, a second matrix), of an (Nmax, K) code. In other words, when K/Nmax is less than or equal to the code rate threshold Rt, K rows and (Nmax−Nmax×Rt) columns in a bottommost part of Z1 are consistent with K rows and (Nmax−Nmax×Rt) columns in a rightmost part of Z2.

When K/Nmax is greater than the code rate threshold Rt, Nmax×Rt rows and (Nmax−K) columns at a rightmost location of Z1 in T are read and denoted as Z23, (K−Nmax×Rt) rows and (Nmax−K) columns adjacent to an upper location of Z23 in T are read and denoted as Z24, and Z23 and Z24 are combined, where Z24 is above Z23, to obtain a matrix used as a matrix, denoted as Z2 (namely, a fourth matrix), of an (Nmax, K) code. In other words, when K/Nmax is greater than the code rate threshold Rt, Nmax×Rt rows and (Nmax−K) columns in a rightmost part of Z1 are consistent with Nmax×Rt rows and (Nmax−K) columns in a bottommost part of Z2.

Figure 9:
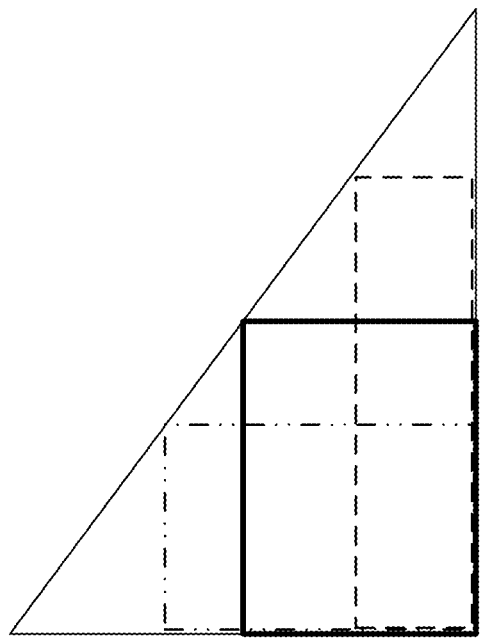
FIG. 9 is a schematic diagram of a principle of matrix reading according to another embodiment of this application.

FIG. 9 is a schematic diagram of a principle of matrix reading according to another embodiment of this application. In other words, a code that is encoded by using a code table and that supports incremental HARQ in this embodiment of this application may be stored in a form of a triangle shown in FIG. 9. However, the storing form is not limited to a triangle in this application. For example, the code may be alternatively represented by a rectangle, or each (N, K) code is separately stored, provided that a nesting feature in this patent application is met.

According to this embodiment of this application, Z2 is read from Z1, and when N remains unchanged, there is a nested relationship between different second matrices read each time. To be specific, when K is K1, the read second matrix is Z4; or when K is K2, the read second matrix is Z5; and if K1 is less than K2 and N of Z4 is the same as N of Z5, K1 rows and (N−K2) columns in a rightmost part of Z4 are consistent with K1 rows and (N−K2) columns in a bottommost part of Z5.

Step 3: Read K rows and (N−K) columns starting from a preset first location in Z2 to obtain a matrix Z3.

Specifically, after the preset first location is determined, K rows and (N−K) columns are read starting from the preset first location in the second matrix each time. Therefore, when K remains unchanged, there is also a nested relationship between different third matrices read each time in the manner in this embodiment of this application. For example, when N is N1, the third matrix obtained by reading K rows and (N1−K) columns starting from the preset first location in the second matrix is Z6; or when N is N2, the third matrix obtained by reading K rows and (N2−K) columns starting from the preset first location in the second matrix is Z7; and if N1 is less than N2, K rows and (N1−K) columns of Z7 starting from the preset first location are consistent with Z6.

Step 4: Add a unit matrix with K rows and K columns to a left side of the matrix Z3 to obtain a generator matrix of an (N, K) linear block code.

Embodiment 3 (The first direction is a topmost part of a matrix, and the second direction is a leftmost part of the matrix):

Step 1: Read, from a preset code table T, a matrix (namely, a first matrix), namely, a matrix Z1, corresponding to a maximum supported code length Nmax and a code rate threshold Rt. The code rate threshold Rt is a code rate boundary value in a nested relationship in this embodiment of this application.

Specifically, in this embodiment of this application, Z1 is read starting from an upper left corner of T. For example, the first column of Z1 is the first column of T, and the first row of Z1 is the first row of T.

Step 2: Determine a value of a first code rate K/Nmax.

When K/Nmax is less than or equal to the code rate threshold Rt, K rows and (Nmax−Nmax×Rt) columns at a topmost location of Z1 in T are read and denoted as Z21, K rows and (Nmax×Rt−K) columns adjacent to a right-side location of Z21 in T are read and denoted as Z22, and Z22 and Z21 are combined to obtain [Z21 Z22], that is, Z21 is on the left of Z22, so that [Z21 Z22] is used as a matrix, denoted as Z2 (namely, a second matrix), of an (Nmax, K) code. In other words, when K/Nmax is less than or equal to the code rate threshold Rt, K rows and (Nmax−Nmax×Rt) columns in a topmost part of Z1 are consistent with K rows and (Nmax−Nmax×Rt) columns in a leftmost part of Z2.

When K/Nmax is greater than the code rate threshold Rt, Nmax×Rt rows and (Nmax−K) columns at a leftmost location of Z1 in T are read and denoted as Z23, (K−Nmax×Rt) rows and (Nmax−K) columns adjacent to a lower location of Z23 in T are read and denoted as Z24, and Z23 and Z24 are combined, where Z23 is above Z24, to obtain a matrix used as a matrix, denoted as Z2 (namely, a fourth matrix), of an (Nmax, K) code. In other words, when K/Nmax is greater than the code rate threshold Rt, Nmax×Rt rows and (Nmax−K) columns in a leftmost part of Z1 are consistent with Nmax×Rt rows and (Nmax−K) columns in a topmost part of Z2.

Figure 10:
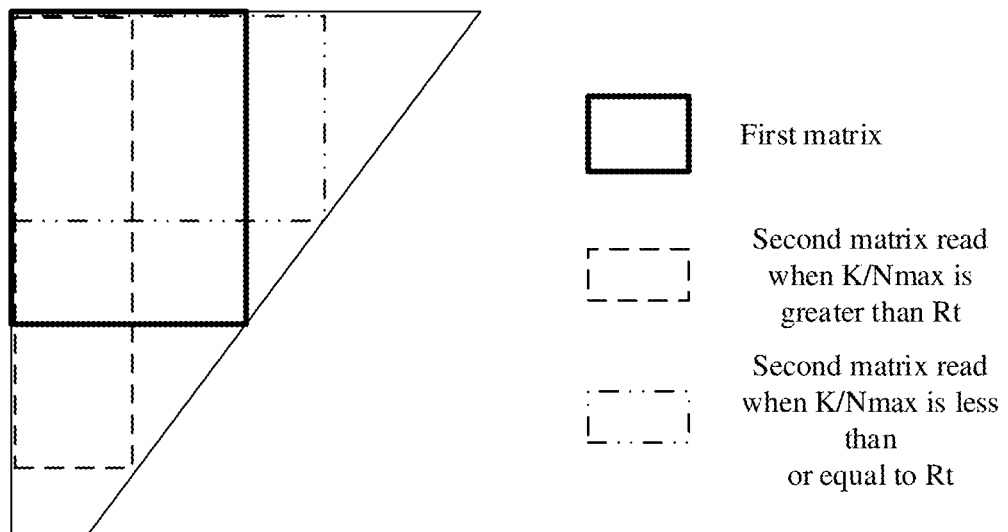
FIG. 10 is a schematic diagram of a principle of matrix reading according to another embodiment of this application.

FIG. 10 is a schematic diagram of a principle of matrix reading according to another embodiment of this application. In other words, a code that is encoded by using a code table and that supports incremental HARQ in this embodiment of this application may be stored in a form of a triangle shown in FIG. 10. However, the storing form is not limited to a triangle in this application. For example, the code may be alternatively represented by a rectangle, or each (N, K) code is separately stored, provided that a nesting feature in this patent application is met.

According to this embodiment of this application, Z2 is read from Z1, and when N remains unchanged, there is a nested relationship between different second matrices read each time. To be specific, when K is K1, the read second matrix is Z4; or when K is K2, the read second matrix is Z5; and if K1 is less than K2 and N of Z4 is the same as N of Z5, K1 rows and (N−K2) columns in a leftmost part of Z4 are consistent with K1 rows and (N−K2) columns in a topmost part of Z5.

Step 3: Read K rows and (N−K) columns starting from a preset first location in Z2 to obtain a matrix Z3.

Specifically, after the preset first location is determined, K rows and (N−K) columns are read starting from the preset first location in the second matrix each time. Therefore, when K remains unchanged, there is also a nested relationship between different third matrices read each time in the manner in this embodiment of this application. For example, when N is N1, the third matrix obtained by reading K rows and (N1−K) columns starting from the preset first location in the second matrix is Z6; or when N is N2, the third matrix obtained by reading K rows and (N2−K) columns starting from the preset first location in the second matrix is Z7; and if N1 is less than N2, K rows and (N1−K) columns of Z7 starting from the preset first location are consistent with Z6.

Step 4: Add a unit matrix with K rows and K columns to a left side of the matrix Z3 to obtain a generator matrix of an (N, K) linear block code.

Embodiment 4 (The first direction is a bottommost part of a matrix, and the second direction is a leftmost part of the matrix):

Step 1: Read, from a preset code table T, a matrix (namely, a first matrix), namely, a matrix Z1, corresponding to a maximum supported code length Nmax and a code rate threshold Rt. The code rate threshold Rt is a code rate boundary value in a nested relationship in this embodiment of this application.

Specifically, in this embodiment of this application, Z1 is read starting from a lower left corner of T. For example, the first column of Z1 is the first column of T, and the last row of Z1 is the last row of T.

Step 2: Determine a value of a first code rate K/Nmax.

When K/Nmax is less than or equal to the code rate threshold Rt, K rows and (Nmax−Nmax×Rt) columns at a bottommost location of Z1 in T are read and denoted as Z21, K rows and (Nmax×Rt−K) columns adjacent to a right-side location of Z21 in T are read and denoted as Z22, and Z22 and Z21 are combined to obtain [Z21 Z22], that is, Z21 is on the left of Z22, so that [Z21 Z22] is used as a matrix, denoted as Z2 (namely, a second matrix), of an (Nmax, K) code. In other words, when K/Nmax is less than or equal to the code rate threshold Rt, K rows and (Nmax−Nmax×Rt) columns in a bottommost part of Z1 are consistent with K rows and (Nmax−Nmax×Rt) columns in a leftmost part of Z2.

When K/Nmax is greater than the code rate threshold Rt, Nmax×Rt rows and (Nmax−K) columns at a leftmost location of Z1 in T are read and denoted as Z23, (K−Nmax×Rt) rows and (Nmax−K) columns adjacent to an upper location of Z23 in T are read and denoted as Z24, and Z23 and Z24 are combined, where Z24 is above Z23, to obtain a matrix used as a matrix, denoted as Z2 (namely, a fourth matrix), of an (Nmax, K) code. In other words, when K/Nmax is greater than the code rate threshold Rt, Nmax×Rt rows and (Nmax−K) columns in a leftmost part of Z1 are consistent with Nmax×Rt rows and (Nmax−K) columns in a bottommost part of Z2.

Figure 11:
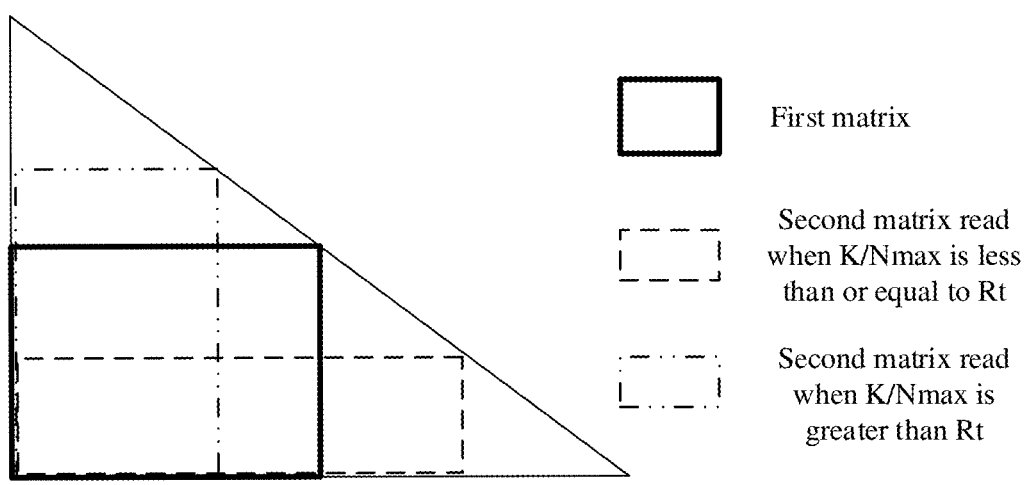
FIG. 11 is a schematic diagram of a principle of matrix reading according to another embodiment of this application.

FIG. 11 is a schematic diagram of a principle of matrix reading according to an embodiment of this application. In other words, a code that is encoded by using a code table and that supports incremental HARQ in this embodiment of this application may be stored in a form of a triangle shown in FIG. 11. However, the storing form is not limited to a triangle in this application. For example, the code may be alternatively represented by a rectangle, or each (N, K) code is separately stored, provided that a nesting feature in this patent application is met.

According to this embodiment of this application, Z2 is read from Z1, and when N remains unchanged, there is a nested relationship between different second matrices read each time. To be specific, when K is K1, the read second matrix is Z4; or when K is K2, the read second matrix is Z5; and if K1 is less than K2 and N of Z4 is the same as N of Z5, K1 rows and (N−K2) columns in a leftmost part of Z4 are consistent with K1 rows and (N−K2) columns in a bottommost part of Z5.

Step 3: Read K rows and (N−K) columns starting from a preset first location in Z2 to obtain a matrix Z3.

Specifically, after the preset first location is determined, K rows and (N−K) columns are read starting from the preset first location in the second matrix each time. Therefore, when K remains unchanged, there is also a nested relationship between different third matrices read each time in the manner in this embodiment of this application. For example, when N is N1, the third matrix obtained by reading K rows and (N1−K) columns starting from the preset first location in the second matrix is Z6; or when N is N2, the third matrix obtained by reading K rows and (N2−K) columns starting from the preset first location in the second matrix is Z7; and if N1 is less than N2, K rows and (N1−K) columns of Z7 starting from the preset first location are consistent with Z6.

Step 4: Add a unit matrix with K rows and K columns to a left side of the matrix Z3 to obtain a generator matrix of an (N, K) linear block code.

According to the encoding method in this embodiment of this application, the obtained linear block code has a nested structure, supports incremental HARQ, and has advantages over a conventional technology in terms of a Hamming distance and performance.

Figure 12:
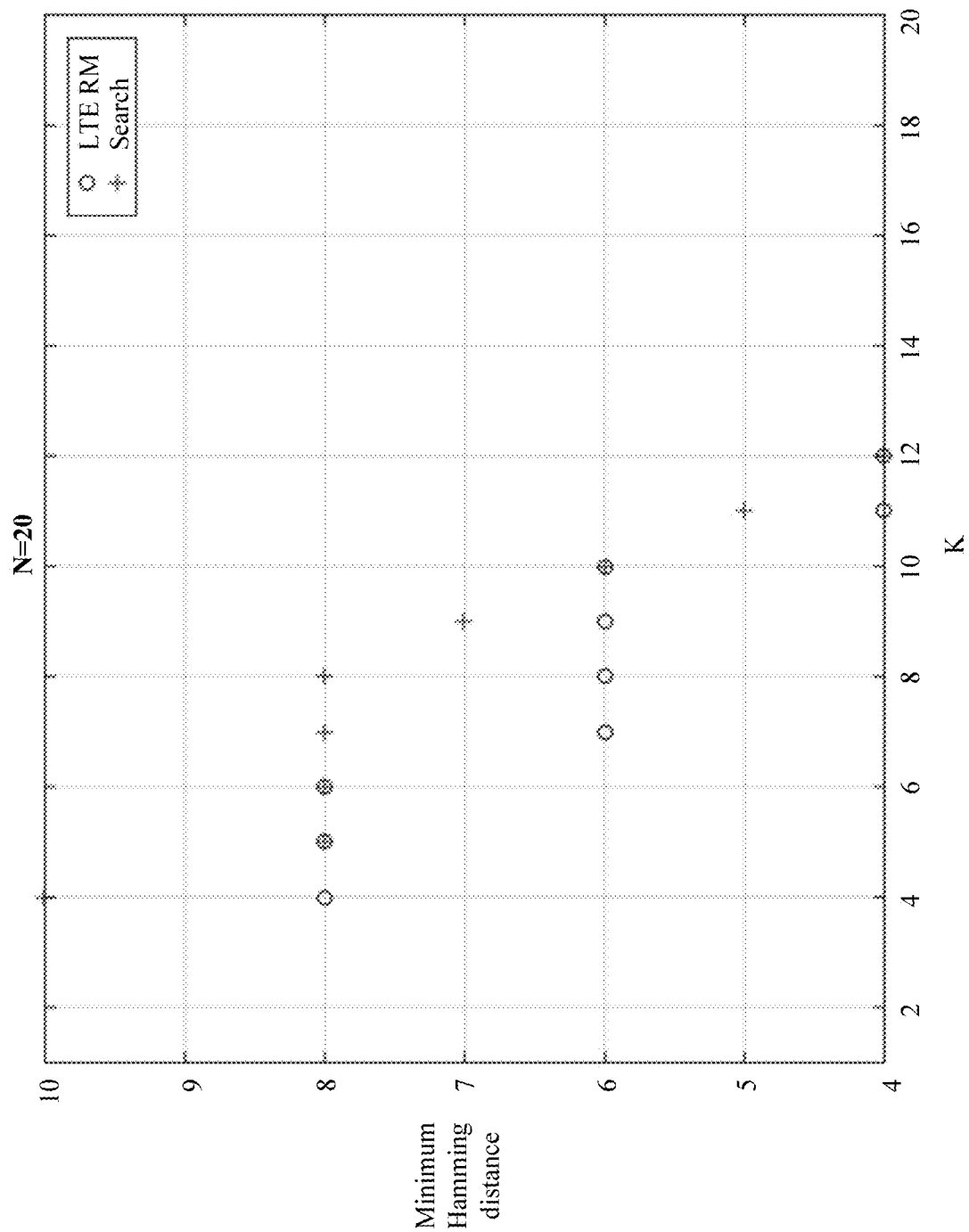
FIG. 12 is a schematic diagram of data of a Hamming distance and performance according to an embodiment of this application.

FIG. 12 is a schematic diagram of data of a Hamming distance and performance according to an embodiment of this application. A horizontal coordinate axis represents a value of K, and a vertical coordinate axis represents a minimum Hamming distance. In FIG. 12, N=20 is used as an example. It can be learned that performing encoding by using the encoding method in this embodiment of this application has advantages over an LTE RM code in the conventional technology in terms of a Hamming distance and performance. For example, when K is 4, 7, 8, 9, and 11, minimum Hamming distances obtained through encoding by using the encoding method in this embodiment of this application are greater than a minimum Hamming distance of the LTE RM code in the conventional technology.

Figure 13:
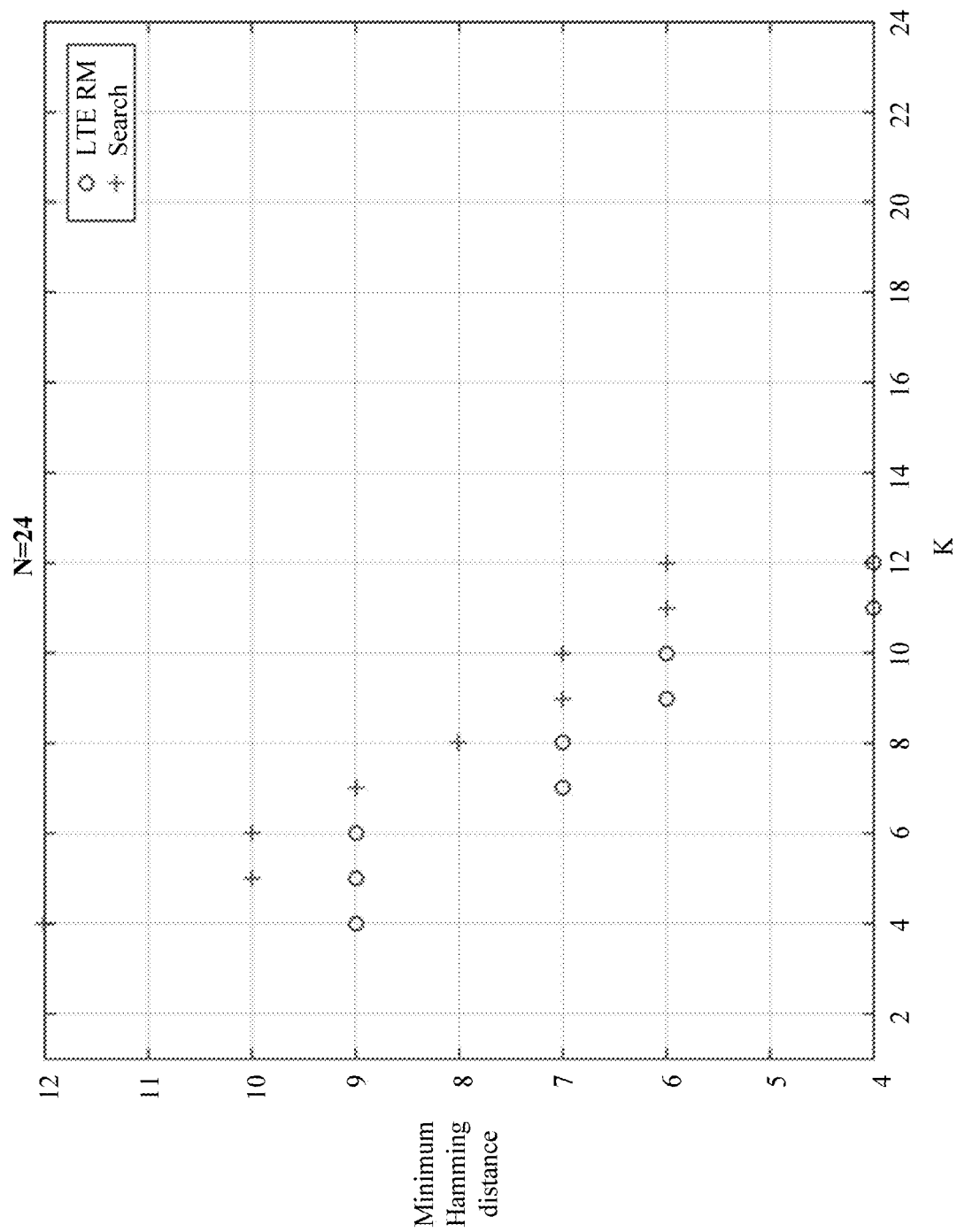
FIG. 13 is a schematic diagram of data of a Hamming distance and performance according to another embodiment of this application.

Further, FIG. 13 is a schematic diagram of data of a Hamming distance and performance according to another embodiment of this application. A horizontal coordinate axis represents a value of K, and a vertical coordinate axis represents a minimum Hamming distance. In FIG. 13, N=24 is used as an example. It can be learned that performing encoding by using the encoding method in this embodiment of this application has advantages over an LTE RM code in the conventional technology in terms of a Hamming distance and performance. For example, when K is 4 to 12, minimum Hamming distances obtained through encoding by using the encoding method in this embodiment of this application are greater than a minimum Hamming distance of the LTE RM code in the conventional technology.

Figure 14:
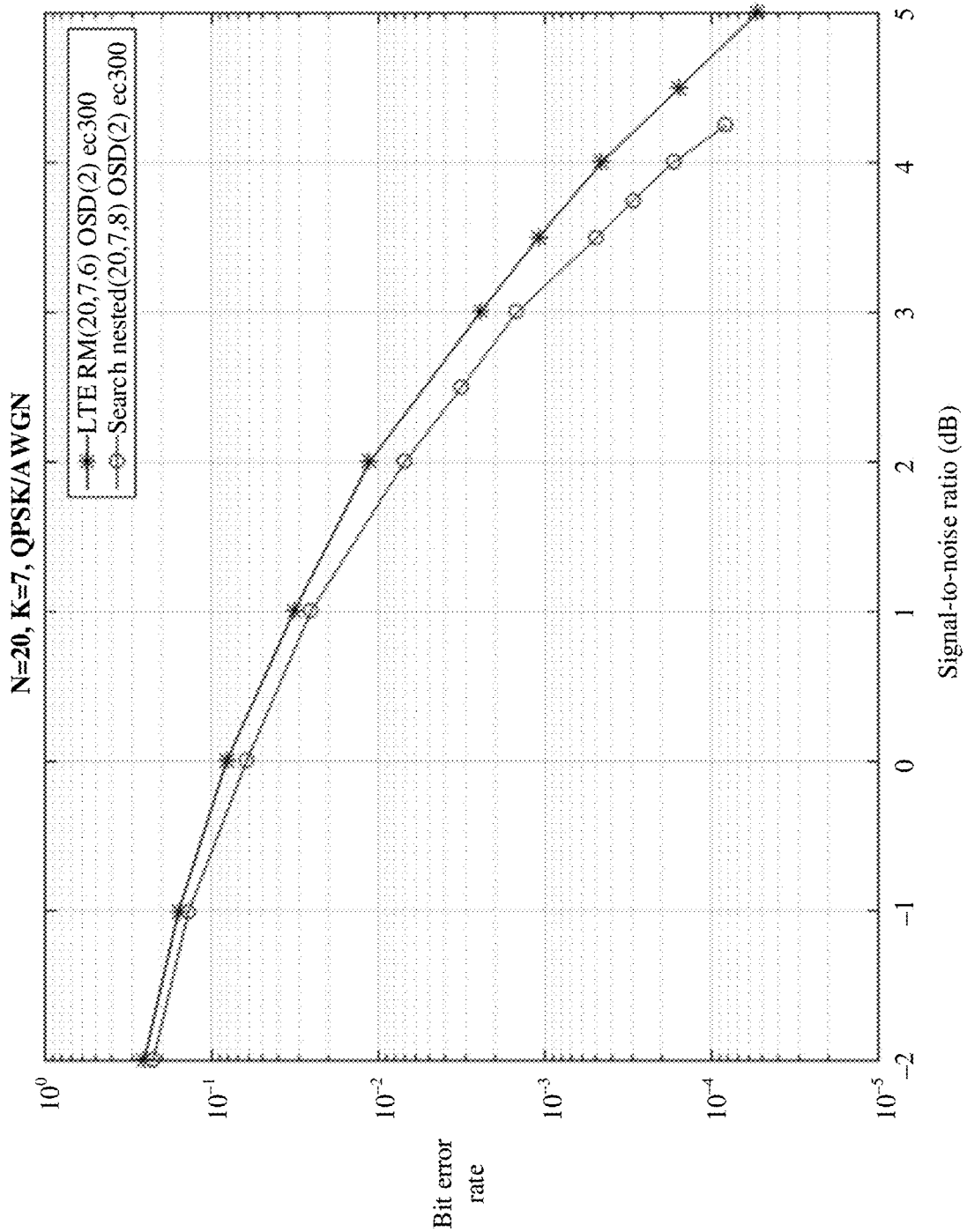
FIG. 14 is a schematic diagram of data of decoding performance according to an embodiment of this application.

FIG. 14 is a schematic diagram of data of decoding performance according to an embodiment of this application. A horizontal coordinate axis represents a signal-to-noise ratio, and a vertical coordinate axis represents a bit error rate. In FIGS. 14, N=20 and K=7 are used as examples. It can be learned that decoding performance for the encoding method in this embodiment of this application superior to decoding performance of an LTE RM code in the conventional technology. In other words, a bit error rate in this embodiment of this application is lower than a bit error rate of the LTE RM code in the conventional technology.

Figure 15:
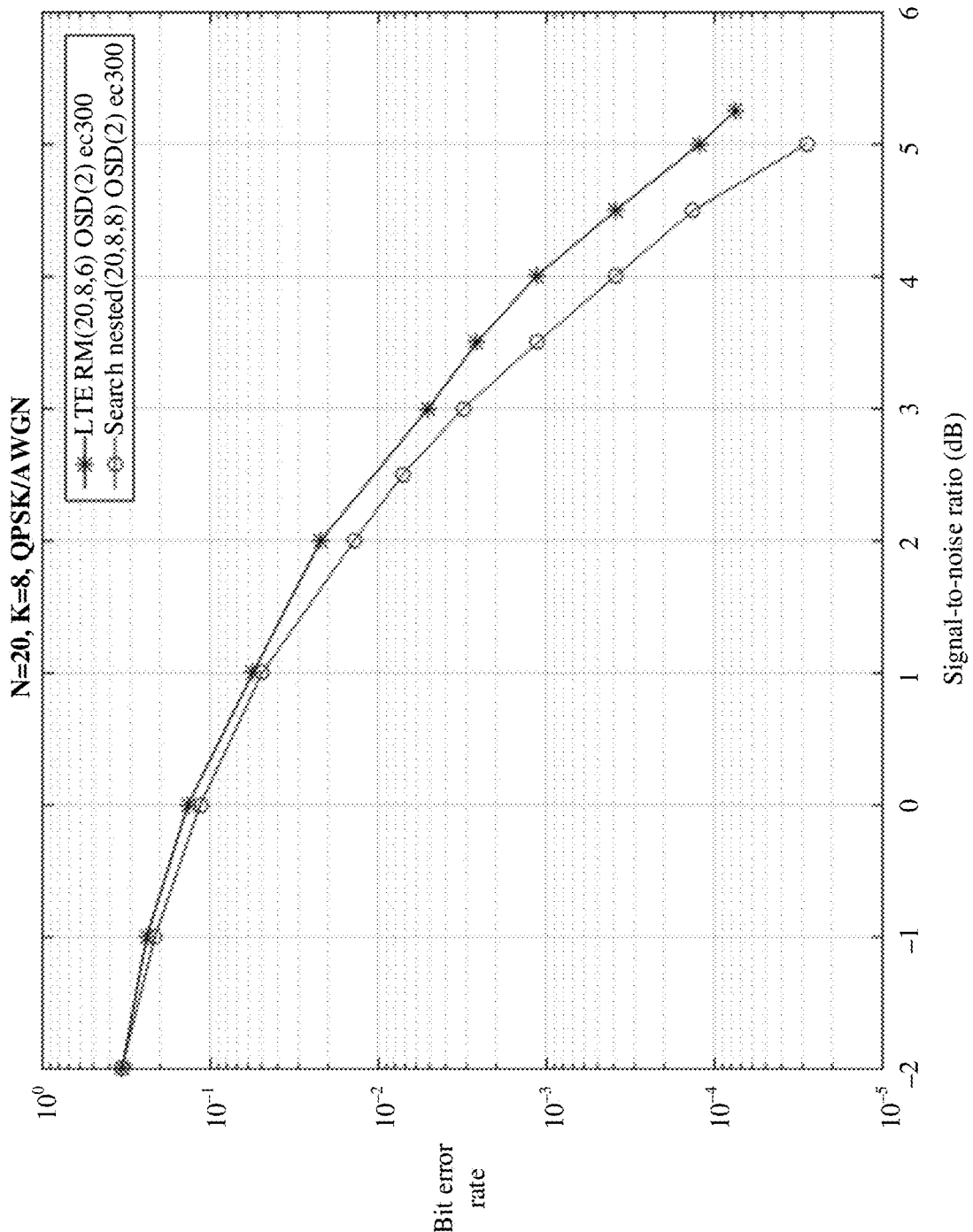
FIG. 15 is a schematic diagram of data of decoding performance according to another embodiment of this application.

FIG. 15 is a schematic diagram of data of decoding performance according to another embodiment of this application. A horizontal coordinate axis represents a signal-to-noise ratio, and a vertical coordinate axis represents a bit error rate. In FIGS. 15, N=20 and K=8 are used as examples. It can be learned that decoding performance for the encoding method in this embodiment of this application superior to decoding performance of an LTE RM code in the conventional technology. In other words, a bit error rate in this embodiment of this application is lower than a bit error rate of the LTE RM code in the conventional technology.

Figure 16:
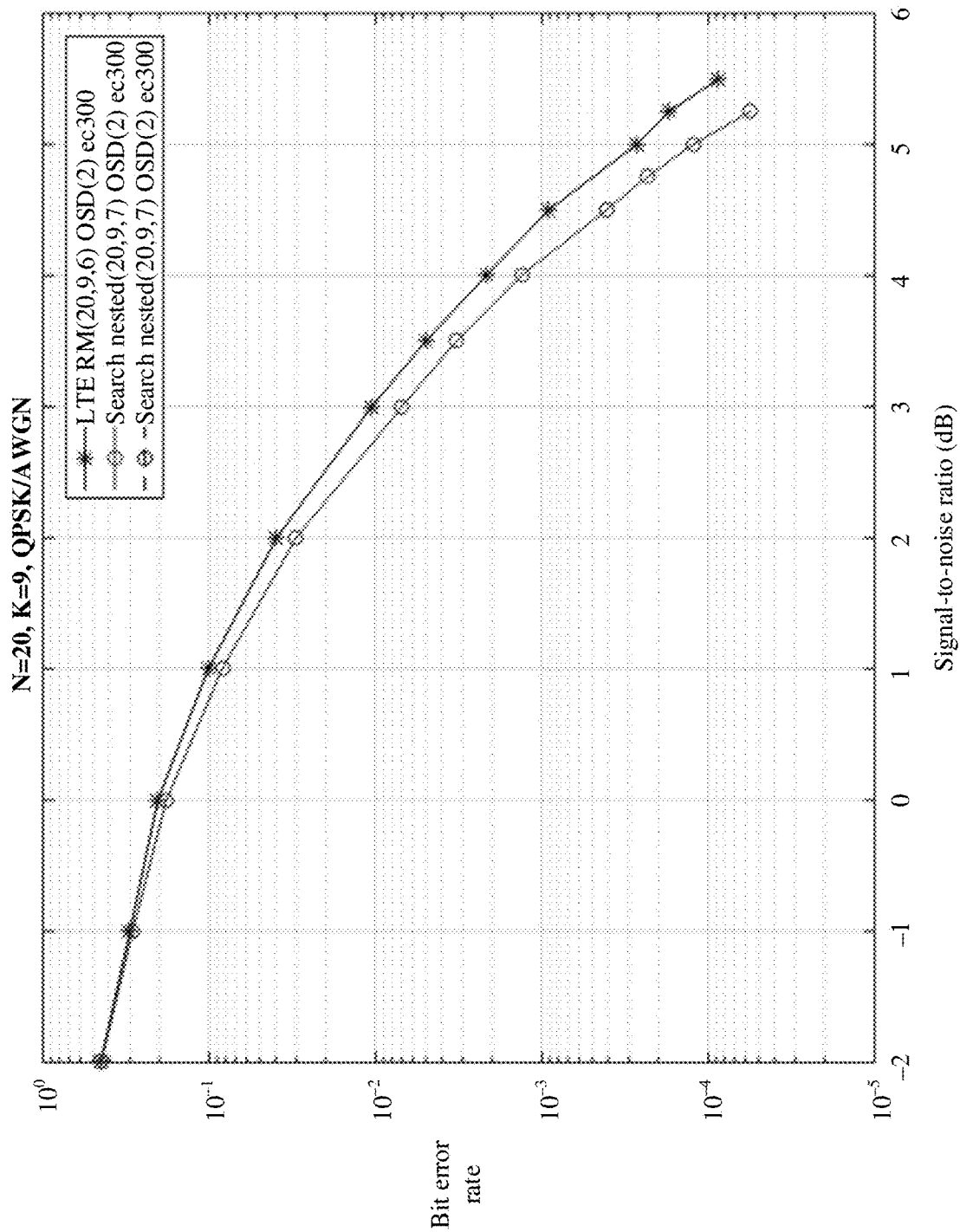
FIG. 16 is a schematic diagram of data of decoding performance according to another embodiment of this application.

FIG. 16 is a schematic diagram of data of decoding performance according to another embodiment of this application. A horizontal coordinate axis represents a signal-to-noise ratio, and a vertical coordinate axis represents a bit error rate. In FIGS. 16, N=20 and K=9 are used as examples. It can be learned that decoding performance for the encoding method in this embodiment of this application superior to decoding performance of an LTE RM code in the conventional technology. In other words, a bit error rate in this embodiment of this application is lower than a bit error rate of the LTE RM code in the conventional technology.

The following describes structures of an encoding apparatus and an encoding device provided in the embodiments of this application with reference to the accompanying drawings.

Figure 17:
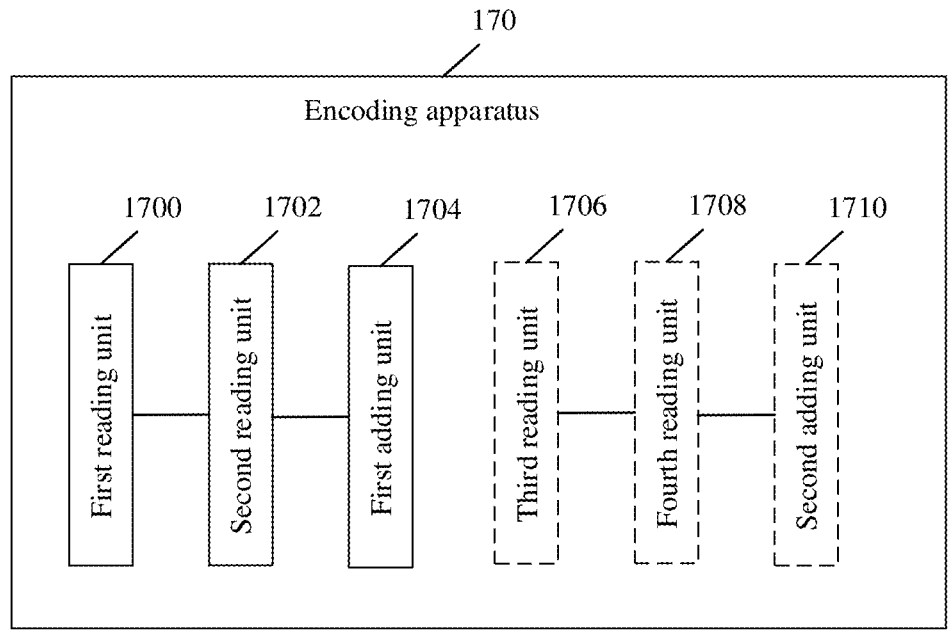
FIG. 17 is a schematic diagram depicting a structure of an encoding apparatus according to an embodiment of this application.

FIG. 17 is a schematic diagram depicting a structure of an encoding apparatus according to an embodiment of this application. The encoding apparatus 170 may be the network device 101 or the terminal device 102 in FIG. 1a. The encoding apparatus 170 may include a first reading unit 1700, a second reading unit 1702, and a first adding unit 1704.

The first reading unit 1700 is configured to: when a first code rate K/Nmax is less than or equal to a code rate threshold Rt, read a second matrix from a preset code table based on a first matrix, where the first matrix includes a matrix that is read from the preset code table and that corresponds to a maximum supported code length Nmax and Rt.

The second reading unit 1702 is configured to read K rows and (N−K) columns starting from a preset first location in the second matrix to obtain a third matrix.

The first adding unit 1704 is configured to add a unit matrix with K rows and K columns to a left side of the third matrix to obtain a generator matrix of an (N, K) linear block code.

K rows and (Nmax−Nmax×Rt) columns of the first matrix in a first direction are consistent with K rows and (Nmax−Nmax×Rt) columns of the second matrix in a second direction.

In an implementation, the first reading unit 1700 may be specifically configured to: when the first code rate K/Nmax is less than or equal to the code rate threshold Rt, read K rows and (Nmax−Nmax×Rt) columns of the first matrix in the first direction from the preset code table to obtain a matrix Z21; read K rows and (Nmax×Rt−K) columns adjacent to the matrix Z21 in a third direction from the preset code table to obtain a matrix Z22, where the third direction is opposite to the second direction; and combine the matrix Z21 and the matrix Z22 to obtain the second matrix.

In an implementation, the second reading unit 1702 may be specifically configured to read K rows and (N−K) columns starting from the leftmost or the rightmost in the second matrix to obtain the third matrix.

In an implementation, the encoding apparatus 170 may further include a third reading unit 1706, a fourth reading unit 1708, and a second adding unit 1710.

The third reading unit 1706 is configured to: when the first code rate K/Nmax is greater than the code rate threshold Rt, read a fourth matrix from the preset code table based on the first matrix.

The fourth reading unit 1708 is configured to read K rows and (N−K) columns starting from a preset second location in the fourth matrix to obtain a fifth matrix.

The second adding unit 1710 is configured to add a unit matrix with K rows and K columns to a left side of the fifth matrix to obtain a generator matrix of an (N, K) linear block code.

Nmax×Rt rows and (Nmax−K) columns of the first matrix in the second direction are consistent with Nmax×Rt rows and (Nmax−K) columns of the fourth matrix in the first direction.

In an implementation, the third reading unit 1706 may be specifically configured to:

when the first code rate K/Nmax is greater than the code rate threshold Rt, read Nmax×Rt rows and (Nmax−K) columns of the first matrix in the second direction from the preset code table to obtain a matrix Z23; read (K−Nmax×Rt) rows and (Nmax−K) columns adjacent to the matrix Z23 in a fourth direction from the preset code table to obtain a matrix Z24, where the fourth direction is opposite to the first direction; and combine the matrix Z23 and the matrix Z24 to obtain the fourth matrix.

In an implementation, the fourth reading unit 1708 may be specifically configured to read K rows and (N−K) columns starting from the leftmost or the rightmost in the fourth matrix to obtain the fifth matrix.

In a possible implementation, the first direction is a topmost part of a matrix, and the second direction is a rightmost part of the matrix; or the first direction is a bottommost part of a matrix, and the second direction is a rightmost part of the matrix; or the first direction is a topmost part of a matrix, and the second direction is a leftmost part of the matrix; or the first direction is a bottommost part of a matrix, and the second direction is a leftmost part of the matrix.

In an implementation, when K is K1, the read second matrix is Z4; or when K is K2, the read second matrix is Z5; and if K1 is less than K2 and N of Z4 is the same as N of Z5, K1 rows and (N−K2) columns of Z4 in the second direction are consistent with K1 rows and (N−K2) columns of Z5 in the first direction.

In an implementation, when N is N1, the third matrix obtained by reading K rows and (N1−K) columns starting from the preset first location in the second matrix is Z6; or when N is N2, the third matrix obtained by reading K rows and (N2−K) columns starting from the preset first location in the second matrix is Z7; and if N1 is less than N2, K rows and (N1−K) columns of Z7 starting from the preset first location are consistent with Z6.

It may be understood that for a specific implementation of each functional unit included in the encoding apparatus 170, refer to the foregoing embodiments. Details are not described herein again.

Figure 18:
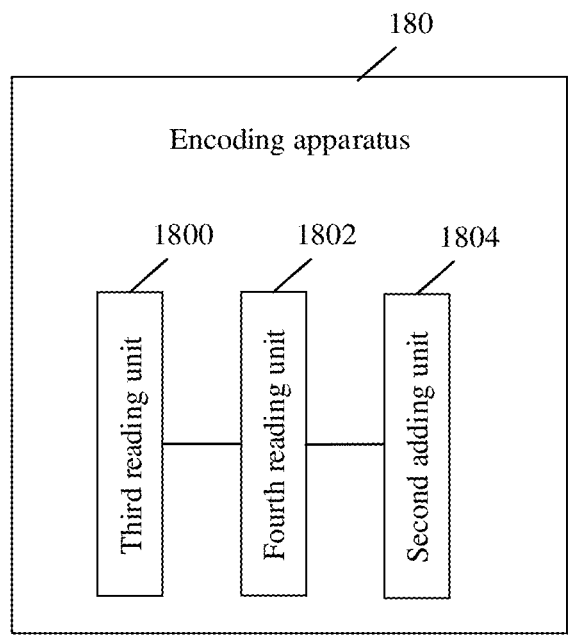
FIG. 18 is a schematic diagram depicting a structure of an encoding apparatus according to another embodiment this application.

FIG. 18 is a schematic diagram depicting a structure of an encoding apparatus according to another embodiment of this application. The encoding apparatus 180 may be the network device 101 or the terminal device 102 in FIG. 1*a*. The encoding apparatus 180 may include a third reading unit 1800, a fourth reading unit 1802, and a second adding unit 1804.

The third reading unit 1800 is configured to: when a first code rate K/Nmax is greater than a code rate threshold Rt, read a fourth matrix from a preset code table based on a first matrix, where the first matrix includes a matrix that is read from the preset code table and that corresponds to a maximum supported code length Nmax and Rt.

The fourth reading unit 1802 is configured to read K rows and (N−K) columns starting from a preset second location in the fourth matrix to obtain a fifth matrix.

The second adding unit 1804 is configured to add a unit matrix with K rows and K columns to a left side of the fifth matrix to obtain a generator matrix of an (N, K) linear block code.

Nmax×Rt rows and (Nmax−K) columns of the first matrix in a second direction are consistent with Nmax×Rt rows and (Nmax−K) columns of the fourth matrix in a first direction.

In an implementation, the third reading unit 1800 may be specifically configured to: when the first code rate K/Nmax is greater than the code rate threshold Rt, read Nmax×Rt rows and (Nmax−K) columns of the first matrix in the second direction from the preset code table to obtain a matrix Z23; read (K−Nmax×Rt) rows and (Nmax×K) columns adjacent to the matrix Z23 in a fourth direction from the preset code table to obtain a matrix Z24, where the fourth direction is opposite to the first direction; and combine the matrix Z23 and the matrix Z24 to obtain the fourth matrix.

In an implementation, the fourth reading unit 1802 may be specifically configured to read K rows and (N−K) columns starting from the leftmost or the rightmost in the fourth matrix to obtain the fifth matrix.

In an implementation, when K is K1, the read second matrix is Z4; or when K is K2, the read second matrix is Z5; and if K1 is less than K2 and N of Z4 is the same as N of Z5, K1 rows and (N−K2) columns of Z4 in the second direction are consistent with K1 rows and (N−K2) columns of Z5 in the first direction.

In an implementation, when N is N1, the fifth matrix obtained by reading K rows and (N1−K) columns starting from the preset second location in the fourth matrix is Z6; or when N is N2, the fifth matrix obtained by reading K rows and (N2−K) columns starting from the preset second location in the fourth matrix is Z7; and if N1 is less than N2, K rows and (N1−K) columns of Z7 starting from the preset second location are consistent with Z6.

It may be understood that for a specific implementation of each functional unit included in the encoding apparatus 180, refer to the foregoing embodiments. Details are not described herein again.

The encoding device provided in the embodiments of this application may be specifically the terminal device shown in FIG. 2 or the network device shown in FIG. 3, including a processor. The processor is configured to invoke a stored program to perform the steps in the foregoing method embodiments. Details are not described herein again.

A person skilled in the art can appreciate that functions described in combination with various illustrative logical blocks, modules, and algorithm steps disclosed and described herein may be implemented by hardware, software, firmware, or any combination thereof. If implemented by software, the functions described by various illustrative logical blocks, modules, and steps may be stored or transmitted as one or more instructions or code on a computer-readable medium and executed by a hardware-based processing unit. The computer-readable medium may include a computer-readable storage medium corresponding to a tangible medium, such as a data storage medium, or any communications medium that facilitates transmission of a computer program from one place to another (for example, based on a communications protocol). In this manner, the computer-readable medium may be generally corresponding to: (1) a non-transitory tangible computer-readable storage medium, or (2) a communications medium such as a signal or a carrier. The data storage medium may be any available medium that can be accessed by one or more computers or one or more processors to retrieve instructions, code, and/or data structures for implementing the technologies described in this application. A computer program product may include a computer-readable medium.

By way of example and not limitation, some computer-readable storage media may include a RAM, a ROM, an EEPROM, a CD-ROM or another optical disc storage apparatus, a magnetic disk storage apparatus or another magnetic storage apparatus, a flash memory, or any other medium that can store required program code in a form of an instruction or a data structure and can be accessed by a computer. In addition, any connection is appropriately referred to as a computer-readable medium. For example, if instructions are sent from a website, a server, or another remote source by using a coaxial cable, an optical cable, a twisted pair, a digital subscriber line (DSL), or a wireless technology such as infrared, radio, and microwave, the coaxial cable, the optical cable, the twisted pair, the DSL, or the wireless technology such as infrared, radio, and microwave is included in a definition of a medium. However, it should be understood that the computer-readable storage medium and the data storage medium may not include a connection, a carrier, a signal, or another transitory medium, but actually mean non-transitory tangible storage media. A disk and an optical disc used in this specification include a compact disc (CD), a laser disc, an optical disc, a digital versatile disc (DVD), and a Blu-ray disc, where the disk generally magnetically reproduces data, and the optical disc optically reproduces data by using a laser. A combination of the foregoing objects shall further be included in the scope of the computer-readable medium.

Instructions may be executed by one or more processors such as one or more digital signal processors (DSP), a general-purpose microprocessor, an application-specific integrated circuit (ASIC), a field programmable gate array (FPGA), or an equivalent integrated or discrete logic circuit. Therefore, the term "processor" used in this specification may refer to the foregoing structure, or any other structure that may be applied to implementation of the technologies described in this specification. Moreover, in some aspects, the functions described in the various illustrative logical blocks, modules, and steps described herein may be provided within dedicated hardware and/or software modules configured to perform encoding and decoding, or incorporated into a combined codec. In addition, the technologies may be completely implemented in one or more circuits or logic elements.

The technologies of this application may be implemented in various apparatuses or devices, including wireless handheld phones, integrated circuits (ICs), or a set of ICs (for example, chipsets). Various components, modules, or units are described in this application to emphasize functional aspects of the apparatus for performing the disclosed technologies, but are not necessarily implemented by different hardware units. Actually, as described above, various units may be combined into a codec hardware unit in combination with appropriate software and/or firmware, or may be provided by interoperable hardware units (including the one or more processors described above).

The foregoing descriptions are merely examples of specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An encoding method, comprising:
   in response to a first code rate K/Nmax being less than or equal to a code rate threshold Rt, reading a first matrix from a preset code table based on a second matrix, wherein the second matrix comprises a matrix that is read from the preset code table and that corresponds to a maximum supported code length Nmax and Rt, where K is an integer and N is an integer;
   reading K rows and (N−K) columns starting from a preset first location in the first matrix to obtain a third matrix; and
   adding a unit matrix with K rows and K columns to a left side of the third matrix to obtain a generator matrix of an (N, K) linear block code,
   wherein K rows and (Nmax−Nmax×Rt) columns of the second matrix in a first direction are consistent with K rows and (Nmax−Nmax×Rt) columns of the first matrix in a second direction.

2. The encoding method according to claim 1, wherein the reading the first matrix from the preset code table based on the second matrix comprises:
   reading K rows and (Nmax−Nmax×Rt) columns of the second matrix in the first direction from the preset code table to obtain a matrix Z21;
   reading K rows and (Nmax×Rt−K) columns adjacent to the matrix Z21 in a third direction from the preset code table to obtain a matrix Z22, wherein the third direction is opposite to the second direction; and
   combining the matrix Z21 and the matrix Z22 to obtain the first matrix.

3. The encoding method according to claim 1, wherein the reading K rows and (N−K) columns starting from the preset first location in the first matrix to obtain a third matrix comprises:
   reading K rows and (N−K) columns starting from a leftmost column or a rightmost column in the first matrix to obtain the third matrix.

4. The encoding method according to claim 1, further comprising:
   in response to the first code rate K/Nmax being greater than the code rate threshold Rt, reading a fourth matrix from the preset code table based on the second matrix;
   reading K rows and (N−K) columns starting from a preset second location in the fourth matrix to obtain a fifth matrix; and adding a unit matrix with K rows and K columns to a left side of the fifth matrix to obtain a generator matrix of an (N, K) linear block code,
wherein Nmax×Rt rows and (Nmax−K) columns of the second matrix in the second direction are consistent with Nmax×Rt rows and (Nmax−K) columns of the fourth matrix in the first direction.

5. The encoding method according to claim 4, wherein the reading the fourth matrix from the preset code table based on the second matrix comprises:
reading Nmax×Rt rows and (Nmax−K) columns of the second matrix in the second direction from the preset code table to obtain a matrix Z23;
reading (K−Nmax×Rt) rows and (Nmax−K) columns adjacent to the matrix Z23 in a third direction from the preset code table to obtain a matrix Z24, wherein the third direction is opposite to the first direction; and
combining the matrix Z23 and the matrix Z24 to obtain the fourth matrix.

6. The encoding method according to claim 4, wherein the reading the K rows and (N−K) columns starting from the preset second location in the fourth matrix to obtain the fifth matrix comprises:
reading K rows and (N−K) columns starting from a leftmost column or a rightmost column in the fourth matrix to obtain the fifth matrix.

7. The encoding method according to claim 1, wherein when K is K1, the read first matrix is Z4; or when K is K2, the read first matrix is Z5; and
if K1 is less than K2 and N of Z4 is the same as N of Z5, K1 rows and (N−K2) columns of Z4 in the second direction are consistent with K1 rows and (N−K2) columns of Z5 in the first direction.

8. The encoding method according to claim 1, wherein when N is N1, the third matrix obtained by reading K rows and (N1−K) columns starting from the preset first location in the first matrix is Z6; or when N is N2, the third matrix obtained by reading K rows and (N2−K) columns starting from the preset first location in the first matrix is Z7; and
if N1 is less than N2, K rows and (N1−K) columns of Z7 starting from the preset first location are consistent with Z6.

9. An encoding method, comprising:
in response to a first code rate K/Nmax being greater than a code rate threshold Rt, reading a first matrix from a preset code table based on a second matrix, wherein the second matrix comprises a matrix that is read from the preset code table and that corresponds to a maximum supported code length Nmax and Rt, where K is an integer and N is an integer;
reading K rows and (N−K) columns starting from a preset first location in the first matrix to obtain a third matrix; and
adding a unit matrix with K rows and K columns to a left side of the third matrix to obtain a generator matrix of an (N, K) linear block code,
wherein Nmax×Rt rows and (Nmax−K) columns of the second matrix in a first direction are consistent with Nmax×Rt rows and (Nmax−K) columns of the first matrix in a second direction.

10. The encoding method according to claim 9, wherein the reading the first matrix from the preset code table based on second matrix comprises:
reading Nmax×Rt rows and (Nmax−K) columns of the second matrix in the first direction from the preset code table to obtain a matrix Z23;
reading (K−Nmax×Rt) rows and (Nmax−K) columns adjacent to the matrix Z23 in a third direction from the preset code table to obtain a matrix Z24, wherein the third direction is opposite to the second direction; and
combining the matrix Z23 and the matrix Z24 to obtain the first matrix.

11. The encoding method according to claim 9, wherein the reading K rows and (N−K) columns starting from the preset first location in the first matrix to obtain the third matrix comprises:
reading K rows and (N−K) columns starting from a leftmost column or a rightmost column in the first matrix to obtain the third matrix.

12. The encoding method according to claim 9, wherein when K is K1, the read first matrix is Z4; or when K is K2, the read first matrix is Z5; and
if K1 is less than K2 and N of Z4 is the same as N of Z5, K1 rows and (N−K2) columns of Z4 in the first direction are consistent with K1 rows and (N−K2) columns of Z5 in the second direction.

13. The encoding method according to claim 9, wherein when N is N1, the third matrix obtained by reading K rows and (N1−K) columns starting from the preset location in the first matrix is Z6; or when N is N2, the third matrix obtained by reading K rows and (N2−K) columns starting from the preset location in the first matrix is Z7; and
if N1 is less than N2, K rows and (N1−K) columns of Z7 starting from the preset location are consistent with Z6.

14. An encoding apparatus, comprising:
a processor; and
a memory having instructions stored thereon that, when executed by the processor, cause the encoding apparatus to:
in response to a first code rate K/Nmax being less than or equal to a code rate threshold Rt, read a first matrix from a preset code table based on a second matrix, wherein the second matrix comprises a matrix that is read from the preset code table and that corresponds to a maximum supported code length Nmax and Rt, where K is an integer and N is an integer,
read K rows and (N−K) columns starting from a preset first location in the first matrix to obtain a third matrix; and
add a unit matrix with K rows and K columns to a left side of the third matrix to obtain a generator matrix of an (N, K) linear block code,
wherein K rows and (Nmax−Nmax×Rt) columns of the second matrix in a first direction are consistent with K rows and (Nmax−Nmax×Rt) columns of the first matrix in a second direction.

15. The encoding apparatus according to claim 14, wherein when the first code rate K/Nmax is less than or equal to the code rate threshold Rt, the encoding apparatus is caused to:
read K rows and (Nmax−Nmax×Rt) columns of the second matrix in the first direction from the preset code table to obtain a matrix Z21;
read K rows and (Nmax×Rt−K) columns adjacent to the matrix Z21 in a third direction from the preset code table to obtain a matrix Z22, wherein the third direction is opposite to the second direction; and
combine the matrix Z21 and the matrix Z22 to obtain the first matrix.

16. The encoding apparatus according to claim 14, wherein the encoding apparatus is caused to read the K rows and (N−K) columns starting from a leftmost column or a rightmost column in the first matrix to obtain the third matrix.

17. The encoding apparatus according to claim 14, wherein the encoding apparatus is further caused to:
in response to the first code rate K/Nmax being greater than the code rate threshold Rt, read a fourth matrix from the preset code table based on the second matrix;
read the K rows and (N−K) columns starting from the preset second location in the fourth matrix to obtain a fifth matrix; and
add a unit matrix with K rows and K columns to a left side of the fifth matrix to obtain a generator matrix of an (N, K) linear block code,
wherein Nmax×Rt rows and (Nmax−K) columns of the second matrix in the second direction are consistent with Nmax×Rt rows and (Nmax−K) columns of the fourth matrix in the first direction.

18. The encoding apparatus according to claim 17, wherein the when the first code rate K/Nmax is greater than the code rate threshold Rt, the encoding apparatus is further caused to:
read Nmax×Rt rows and (Nmax−K) columns of the second matrix in the second direction from the preset code table to obtain a matrix Z23;
read (K−Nmax×Rt) rows and (Nmax−K) columns adjacent to the matrix Z23 in a third direction from the preset code table to obtain a matrix Z24, wherein the third direction is opposite to the first direction; and
combine the matrix Z23 and the matrix Z24 to obtain the fourth matrix.

19. The encoding apparatus according to claim 17, wherein the encoding apparatus is caused to read the K rows and (N−K) columns from a leftmost column or a rightmost column in the fourth matrix to obtain the fifth matrix.

20. The encoding apparatus according to claim 14, wherein when K is K1, the read first matrix is Z4; or when K is K2, the read first matrix is Z5; and
if K1 is less than K2 and N of Z4 is the same as N of Z5, K1 rows and (N−K2) columns of Z4 in the second direction are consistent with K1 rows and (N−K2) columns of Z5 in the first direction.

* * * * *

UNITED STATES PATENT AND TRADEMARK OFFICE
CERTIFICATE OF CORRECTION

PATENT NO. : 11,777,532 B2
APPLICATION NO. : 17/587425
DATED : October 3, 2023
INVENTOR(S) : Dai et al.

It is certified that error appears in the above-identified patent and that said Letters Patent is hereby corrected as shown below:

In the Claims

Column 29, Line 4-7 (Claim 4), which should be replaced with the following:
"wherein Nmax×Rt rows and (Nmax–K) columns of the second matrix in the second direction are consistent with Nmax×Rt rows and (Nmax–K) columns of the fourth matrix in the first direction."

Column 29, Line 11-13 (Claim 5), which should be replaced with the following:
"reading Nmax×Rt rows and (Nmax–K) columns of the second matrix in the second direction from the preset code table to obtain a matrix Z23;"

Column 29, Line 58-61 (Claim 9), which should be replaced with the following:
"wherein Nmax×Rt rows and (Nmax–K) columns of the second matrix in a first direction are consistent with Nmax×Rt rows and (Nmax–K) columns of the first matrix in a second direction."

Column 31, Line 15-18 (Claim 17), which should be replaced with the following:
"wherein Nmax×Rt rows and (Nmax–K) columns of the second matrix in the second direction are consistent with Nmax×Rt rows and (Nmax–K) columns of the fourth matrix in the first direction."

Signed and Sealed this
Twelfth Day of December, 2023

Katherine Kelly Vidal
*Director of the United States Patent and Trademark Office*